United States Patent
Citta

(10) Patent No.: US 10,359,887 B2
(45) Date of Patent: *Jul. 23, 2019

(54) CAPACITIVE SENSOR FILTERING APPARATUS, METHOD, AND SYSTEM

(71) Applicant: TOUCHSENSOR TECHNOLOGIES, LLC, Wheaton, IL (US)

(72) Inventor: James W. Citta, Lombard, IL (US)

(73) Assignee: TOUCHSENSOR TECHNOLOGIES, LLC, Wheaton, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/025,084

(22) Filed: Jul. 2, 2018

(65) Prior Publication Data

US 2018/0307376 A1    Oct. 25, 2018

Related U.S. Application Data

(63) Continuation of application No. 15/431,161, filed on Feb. 13, 2017, now Pat. No. 10,013,113, which is a continuation-in-part of application No. 14/831,501, filed on Aug. 20, 2015, now Pat. No. 9,569,054, which is a continuation-in-part of application No.
(Continued)

(51) Int. Cl.
*G06F 3/041* (2006.01)
*G06F 3/044* (2006.01)
*H03K 17/96* (2006.01)

(52) U.S. Cl.
CPC .......... *G06F 3/0418* (2013.01); *G06F 3/044* (2013.01); *G06F 3/0416* (2013.01); *H03K 17/962* (2013.01); *G06F 2203/04108* (2013.01); *H03K 2217/96066* (2013.01); *H03K 2217/96071* (2013.01)

(58) Field of Classification Search
CPC .......... G06F 2203/04108; G06F 3/044; G06F 2203/04101; G06F 3/0416; G06F 3/0418; H03K 17/962; H03K 2217/96066; H03K 2217/96071

See application file for complete search history.

(56) References Cited

U.S. PATENT DOCUMENTS

| 4,038,539 A | 7/1977 | Van Cleave |
| 5,956,663 A | 9/1999 | Eryurek |

(Continued)

FOREIGN PATENT DOCUMENTS

| WO | WO 2001/033540 | 5/2001 |
| WO | WO 2005/114369 | 12/2005 |
| WO | WO 2011/149750 | 12/2011 |

OTHER PUBLICATIONS

Mohammad et al, "What is the Walsh-Hadamard Transform and what is it good for?", http://dsp.stackexchange.com/questions/1693/what-is-the-walsh-hadamard-transform-and-what-is-it-good-for, pp. 1-2 (2013).

(Continued)

*Primary Examiner* — Hong Zhou
(74) *Attorney, Agent, or Firm* — Barnes & Thornburg LLP

(57) ABSTRACT

A transform is used to transform raw sensor data from the time domain to the frequency or sequency domain. The transformed data falls into several signal bins. The transformed data in at least one of the signal bins is analyzed to determine whether a touch event or release event has occurred.

17 Claims, 39 Drawing Sheets

FFT of Fig 3 (Real data shown bins 0-7)

Related U.S. Application Data

14/463,298, filed on Aug. 19, 2014, now Pat. No. 9,430,111.

(60) Provisional application No. 62/058,740, filed on Oct. 2, 2014, provisional application No. 61/867,197, filed on Aug. 19, 2013.

(56) References Cited

U.S. PATENT DOCUMENTS

| | | |
|---|---|---|
| 6,297,811 B1 | 10/2001 | Kent et al. |
| 6,583,676 B2 | 6/2003 | Krah et al. |
| 7,146,014 B2 | 12/2006 | Hannah |
| 7,176,902 B2 | 2/2007 | Peterson, Jr. et al. |
| 7,292,229 B2 | 11/2007 | Morag et al. |
| 7,372,455 B2 | 5/2008 | Perski et al. |
| 7,409,854 B2 | 8/2008 | Teolis et al. |
| 7,470,352 B2 | 12/2008 | Eversmann et al. |
| 7,843,439 B2 | 11/2010 | Perski et al. |
| 7,881,882 B2 | 2/2011 | Maxey et al. |
| 8,073,157 B2 | 12/2011 | Mao et al. |
| 8,121,813 B2 | 2/2012 | Ren |
| 8,194,242 B2 | 6/2012 | Derksen et al. |
| 8,217,918 B2 | 7/2012 | Morag et al. |
| 8,228,311 B2 | 7/2012 | Perski et al. |
| 8,289,162 B2 | 10/2012 | Mooring et al. |
| 8,373,677 B2 | 2/2013 | Perski et al. |
| 8,400,427 B2 | 3/2013 | Perski et al. |
| 8,436,833 B2 | 5/2013 | King et al. |
| 8,493,187 B2 | 7/2013 | Rowland et al. |
| 8,493,197 B2 | 7/2013 | Nakanishi |
| 2002/0196066 A1 | 12/2002 | Krah et al. |
| 2003/0214486 A1 | 11/2003 | Roberts |
| 2003/0228025 A1 | 12/2003 | Hannah |
| 2004/0155871 A1 | 8/2004 | Perski et al. |
| 2005/0029099 A1 | 2/2005 | Eversmann et al. |
| 2006/0233389 A1 | 10/2006 | Mao et al. |
| 2007/0026325 A1 | 2/2007 | Derksen et al. |
| 2007/0171211 A1 | 7/2007 | Perski et al. |
| 2007/0187156 A1 | 8/2007 | Buchel |
| 2008/0077333 A1 | 3/2008 | Maxey et al. |
| 2008/0218494 A1 | 9/2008 | Perski et al. |
| 2010/0010761 A1 | 1/2010 | Nordebo et al. |
| 2010/0191502 A1 | 7/2010 | Ren et al. |
| 2010/0308974 A1 | 12/2010 | Rowland et al. |
| 2011/0025649 A1 | 2/2011 | Sheikhzadeh Nadjar |
| 2011/0055305 A1 | 3/2011 | Matsushima |
| 2011/0084857 A1 | 4/2011 | Marino et al. |
| 2011/0199226 A1 | 8/2011 | Gong et al. |
| 2012/0056841 A1 | 3/2012 | Krenik et al. |
| 2012/0126803 A1 | 5/2012 | Goldfine et al. |
| 2012/0162131 A1 | 7/2012 | Perski et al. |
| 2012/0166145 A1 | 7/2012 | Kent |
| 2012/0176179 A1 | 7/2012 | Harders |
| 2012/0212240 A1 | 8/2012 | Young |
| 2012/0212452 A1 | 8/2012 | Lin et al. |
| 2012/0280928 A1 | 11/2012 | Ludwig |
| 2012/0293338 A1 | 11/2012 | Chaffey et al. |
| 2012/0293458 A1 | 11/2012 | Perski et al. |
| 2012/0303315 A1 | 11/2012 | Vedova |
| 2013/0022214 A1 | 1/2013 | Dickins et al. |
| 2013/0050132 A1 | 2/2013 | Maravilla et al. |
| 2013/0093725 A1 | 4/2013 | Reynolds |
| 2013/0113707 A1 | 5/2013 | Perski et al. |
| 2013/0171925 A1 | 7/2013 | Oda |
| 2013/0174345 A1 | 7/2013 | Leu et al. |
| 2013/0187664 A1 | 7/2013 | Herraiz et al. |
| 2014/0022201 A1 | 1/2014 | Boychuk |
| 2014/0035874 A1 | 2/2014 | Iiuka |
| 2014/0062922 A1 | 3/2014 | Tang |
| 2014/0062953 A1 | 3/2014 | Savitsky |
| 2014/0375571 A1* | 12/2014 | Hirata .................. G06F 3/0416 345/173 |
| 2015/0212648 A1 | 7/2015 | Moravcik |

OTHER PUBLICATIONS

International Search Report and Written Opinion issued in International Patent Application No. PCT/US2015/016361, dated May 28, 2015.

Gumas, "A century old, the fast Hadamard transform proves useful in digital communications," http://archive.chipcenter.com/dsp/DSP000517F1.html, pp. 1-8 (1997).

International Search Report and Written Opinion issued in International Patent Application No. PCT/US2014/051709, dated Nov. 10, 2014.

\* cited by examiner

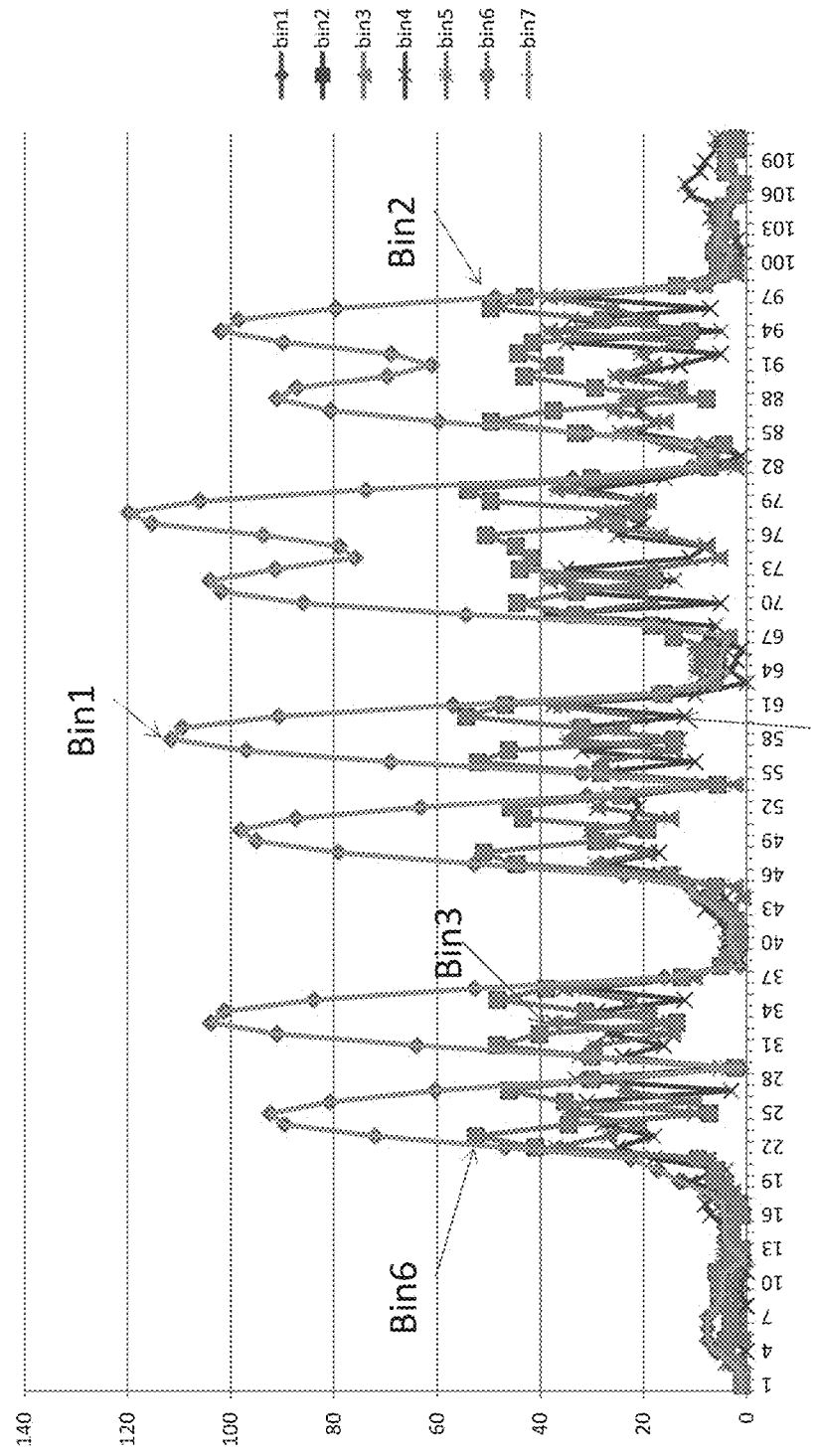

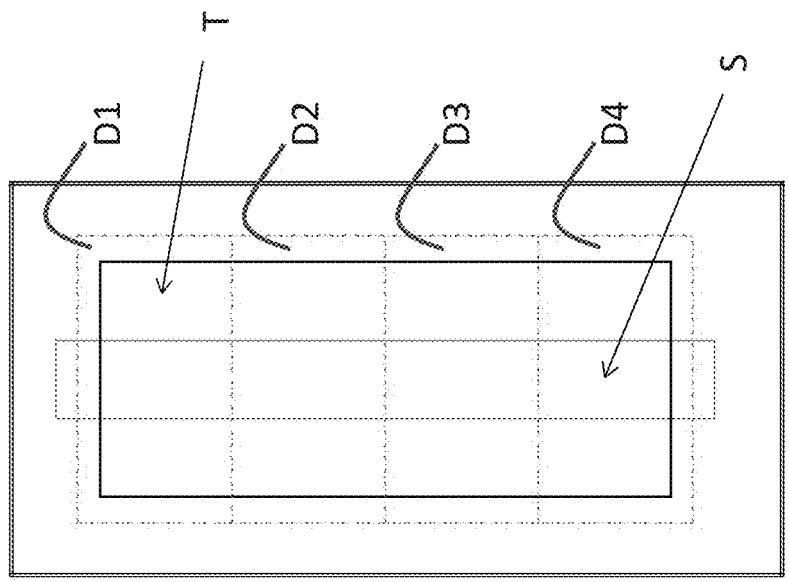
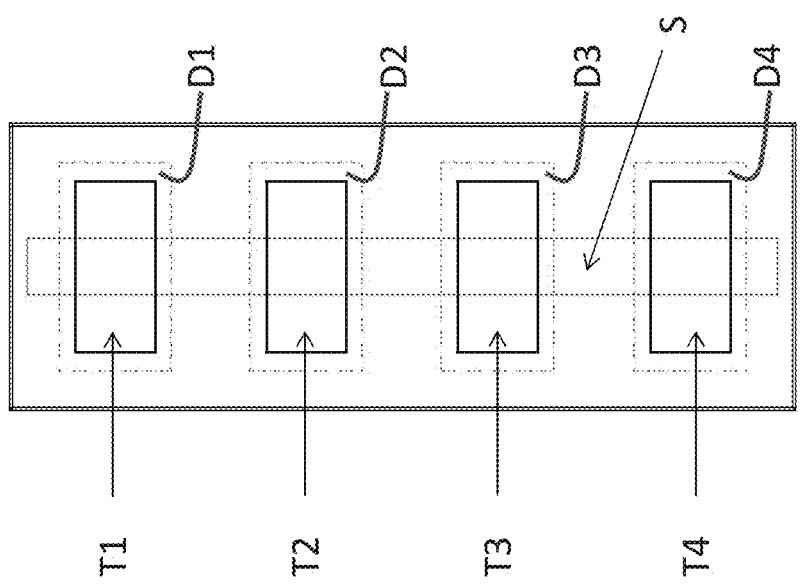

CAPACITIVE SENSOR FILTERING APPARATUS, METHOD, AND SYSTEM

CROSS-REFERENCE TO RELATED APPLICATIONS

This application claims priority under 35 U.S.C. § 120 as a continuation of U.S. patent application Ser. No. 15/431,161, filed on Feb. 13, 2017; which claims priority under 35 U.S.C. § 120 as a continuation-in-part of U.S. patent application Ser. No. 14/831,501, filed on Aug. 20, 2015; which claims benefit under 35 U.S.C. § 119 of U.S. Provisional Patent Application No. 62/058,740, filed on Oct. 2, 2014, and which also claims priority under 35 U.S.C. § 120 as a continuation-in-part of U.S. patent application Ser. No. 14/463,298, filed on Aug. 19, 2014; which claims benefit under 35 U.S.C. § 119 of U.S. Provisional Patent Application No. 61/867,197, filed on Aug. 19, 2013, and incorporates by reference the disclosures thereof in their entireties.

BACKGROUND

Known capacitive sensors typically include a sensor electrode disposed on a dielectric substrate and a control circuit connected to the sensor electrode. A panel or substrate made of glass, plastic, or another suitable dielectric material may overlie the sensor electrode and define a touch surface overlying the sensor electrode.

The control circuit provides an excitation voltage to, and thereby generates an electric field about, the sensor electrode. This electric field establishes a capacitance, sometimes referred to as a parasitic capacitance, from the sensor electrode to ground or another reference potential (the terms "ground" and "other reference potential" may be used interchangeably herein). Introduction of a stimulus, for example, a user's finger, to or near the sensor electrode or corresponding touch surface establishes an additional capacitance, sometimes referred to as a finger capacitance, from the electrode, through the finger, to ground, thereby changing the overall sensor electrode-to-ground capacitance.

The control circuit also detects and monitors the sensor electrode-to-ground capacitance. The control circuit uses this data in conjunction with predetermined criteria to deem whether or not a touch event or proximity event has occurred. The control circuit could be configured to deem a touch event to occur when a stimulus touches the sensor electrode or corresponding touch surface. The control circuit could be configured to deem a proximity event to occur when the stimulus is near but not touching the sensor electrode or the touch surface. The control circuit could be configured to deem touch or proximity events to occur under other circumstances, as well, as would be understood by one skilled in the art.

The control circuit could be configured to deem whether or not a touch event or proximity has occurred by comparing the sensor electrode-to-ground raw capacitance at any given time, or for any given sample of raw capacitive data points, to a predetermined threshold and/or by comparing the raw capacitance to a baseline raw capacitance. The baseline raw capacitance typically would be a time-averaged measure of raw counts when no stimulus is near or proximate the sensor electrode.

For example, the control circuit could be configured to deem a touch event or proximity event to occur when the raw count exceeds or falls below a predetermined threshold. Alternatively, the control circuit could be configured to deem a touch event or proximity event to occur when the raw count deviates from the baseline raw count by at least a predetermined amount or difference.

In some embodiments, the control circuit could be configured to recognize and distinguish between both touch and proximity events. For example, the control circuit could be configured to deem a proximity event to occur when the raw count exceeds or falls below a first predetermined threshold or when the raw count deviates from the baseline raw count by at least a first predetermined difference. The control circuit also could be configured to deem a touch event to occur when the raw count exceeds or falls below a second predetermined threshold or when the raw count deviates from the baseline raw count by at least a second predetermined difference. Typically, the raw count would deviate from the baseline by a greater amount in response to touch of the stimulus to the sensor electrode or touch surface compared to mere proximity of the stimulus to the sensor electrode or touch surface. As such, the first predetermined threshold or difference typically would lie between the baseline and the second predetermined threshold or difference.

Conventional capacitive touch systems may have certain drawbacks. For example, the control circuits typically need to be tuned for a particular touch scenario. For example, they typically need to be tuned to detect touch by or proximity of a bare finger versus touch by or proximity of a gloved finger. Touch by or proximity of a bare finger typically would result in a greater finger capacitance and, therefore, a greater change in raw capacitance versus the baseline raw capacitance, than would touch by or proximity of a gloved finger. Indeed, the change in raw capacitance resulting from touch by a bare finger could be twice (or more or less) than the change in raw capacitance resulting from touch by a gloved finger.

As such, a system that is tuned to reliably detect touch by or proximity of a bare finger might not be sufficiently sensitive to detect touch by or proximity of a gloved finger. That is, touch by a gloved finger might not yield a change in raw counts exceeding the touch or proximity threshold. Although a system can be tuned to respond to touch by a gloved finger, a system so tuned might be overly sensitive to a bare hand such that a touch is deemed to have occurred when the bare hand is merely proximate but not touching the touch surface. A system so tuned also might be unacceptably susceptible to falsely "detect" touch when touch has not occurred because of noise or the presence of water, other contaminants, or spurious stimuli proximate or in contact with the sensing electrode or touch surface.

BRIEF DESCRIPTION OF THE DRAWINGS

FIG. 29 illustrates frequency domain distribution curves showing magnitude data associated with frequency bins 1-7;

FIG. 30 illustrates an alternate electrode structure;

FIG. 31 illustrates another alternate electrode structure;

FIG. 42 illustrates sequency domain distribution curves associated with sequency bin 1, the absolute value of sequency bin 4 plus the absolute value of sequency bin 5 times a gain factor, and the absolute value of sequency bin 6 plus the absolute value of sequency bin 7 times a gain factor during a wave gesture; and FIG. 43 illustrates sequency domain distribution curves associated with sequency bin 1, the absolute value of sequency bin 4 plus the absolute value of sequency bin 5 times a gain factor, and the absolute value of sequency bin 6 plus the absolute value of sequency bin 7 times a gain factor during a hover gesture.

DETAILED DESCRIPTION OF THE DRAWINGS

Figure 1:
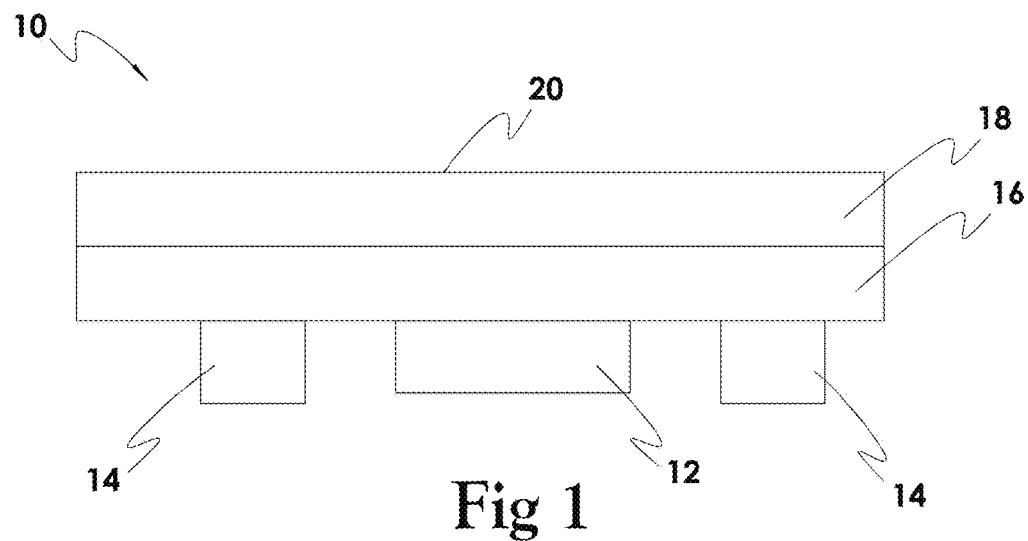
FIG. 1 illustrates a capacitive sensor 10 including a sensing electrode 12 and ground plane 14 disposed on a circuit carrier 16 attached to a touch panel 18 defining a touch surface 20 corresponding to sensing electrode 12.

FIG. 1 illustrates a typical capacitive sensor 10. Sensor 10 includes a sensor electrode 12 and a ground plane 14 disposed on a dielectric circuit carrier substrate 16. Circuit carrier substrate 16 typically would be, for example, a piece of glass or plastic, a printed wiring board or a flexible circuit carrier. A touch surface substrate 18, typically a piece of glass, plastic, or other suitable dielectric material, overlies and is attached to circuit carrier substrate 16. Touch surface substrate 18 defines a touch surface 20. Touch surface 20 overlies and generally is aligned with sensor electrode 12. In some embodiments, touch surface substrate 18 could be omitted, and touch surface 20 could be similarly defined by circuit carrier substrate 16, for example, the surface of circuit carrier substrate opposite the surface upon which the sensor electrode is disposed. A control circuit (not shown) is electrically connected to sensor electrode 12. The control system may include a microprocessor, means for exciting (for example, providing an excitation voltage to) sensor electrode 12, and means for detecting capacitance from sensor electrode 12 to ground or another reference potential (the terms "ground" and "reference potential" may be used interchangeably herein), among other components.

Figure 2A:
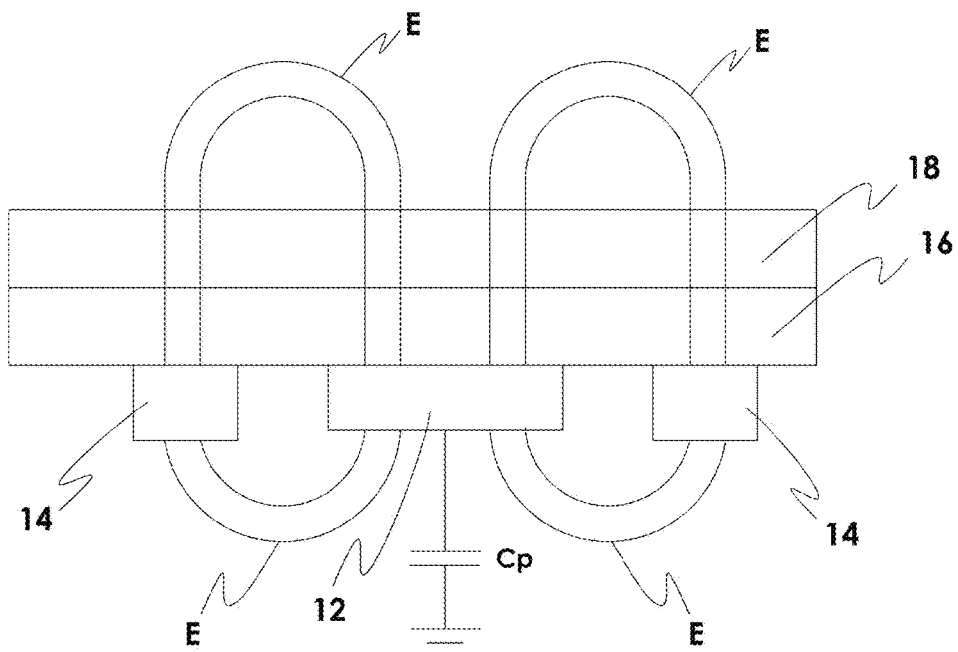
FIG. 2A illustrates the capacitance about sensor 10 in the steady state in the absence of a stimulus.

In operation, the control circuit excites, and thereby generates an electric field represented by electric field lines E about, sensor electrode 12. This electric field E couples to ground through ground plane 14 and thereby generates a parasitic capacitance $C_p$ between sensor electrode 12 and ground. This phenomenon is illustrated in FIG. 2A. In the steady state, in the absence of a stimulus proximate or touching touch surface 20 or sensor electrode 12, this parasitic capacitance has a time-averaged baseline value $C_p$.

Figure 2B:
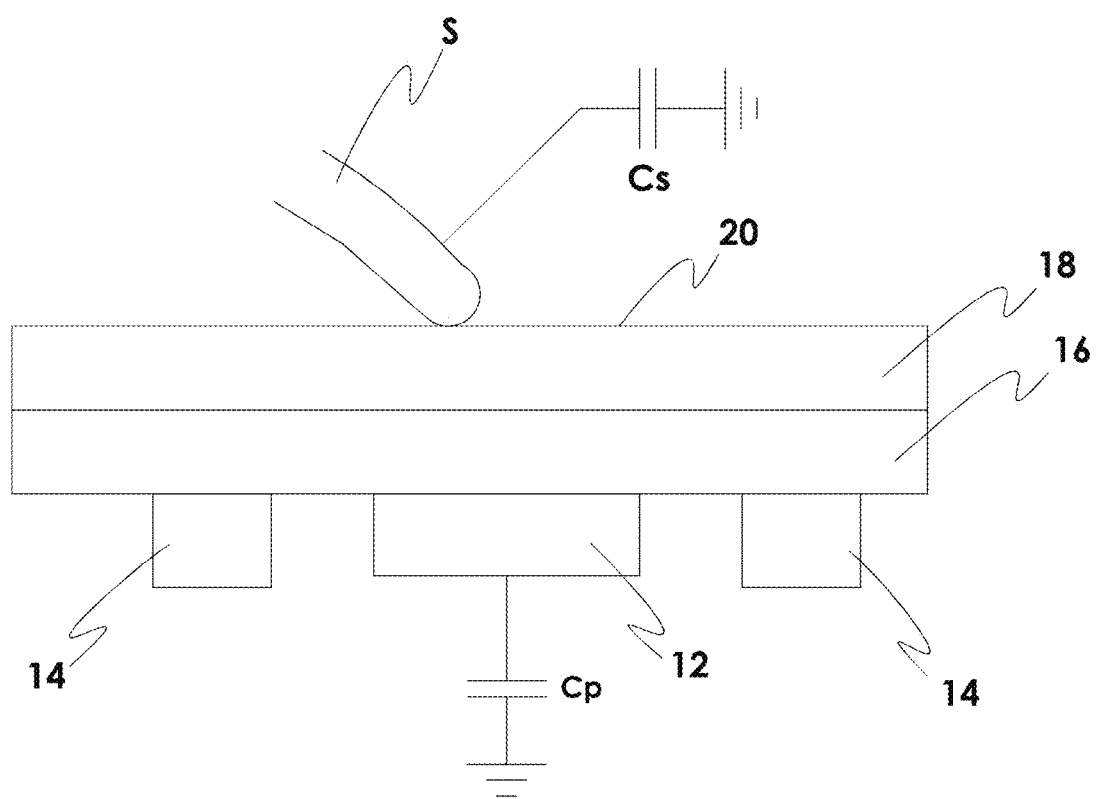
FIG. 2B illustrates the capacitances about sensor 10 with a stimulus S touching touch surface 20.

When a stimulus S, for example, a user's finger or other conductive object, is introduced proximate sensor electrode 12, an additional capacitance, sometimes referred to as a stimulus capacitance, $C_s$ is established between sensor electrode 12 and ground through the stimulus S. This phenomenon is shown in FIG. 2B, wherein stimulus S is shown touching touch surface 20, which is proximate sensor electrode 12. (The field lines E are not shown in FIG. 2B for clarity.) The stimulus capacitance $C_s$ would reach a theoretical maximum if stimulus S were to contact sensor electrode 12. The stimulus capacitance reaches a practical maximum when the stimulus comes into contact with touch surface 20. The stimulus capacitance $C_s$ would have a lesser value when the stimulus S is proximate, but not in contact with, touch surface 20 than it would when the stimulus is in contact with touch surface 20.

In typical applications, the system capacitance (including primarily the parasitic capacitance $C_p$) is measured and processed in terms of raw counts, as would be understood by one skilled in the art. In the steady state, with no stimulus proximate or touching touch surface 20, the raw count has a time-averaged baseline value. Depending on the convention used, the raw count increases or decreases from the baseline value to another value when a stimulus is introduced near or into contact with touch surface 20. (The drawings illustrate the raw count decreasing from the baseline in response to such introduction of a stimulus and corresponding distribution curves for the raw count transformed into the sequency and frequency domains. In embodiments wherein the raw count increases from the baseline in response to such introduction of a stimulus, the curves would be inverted.)

Figure 3:
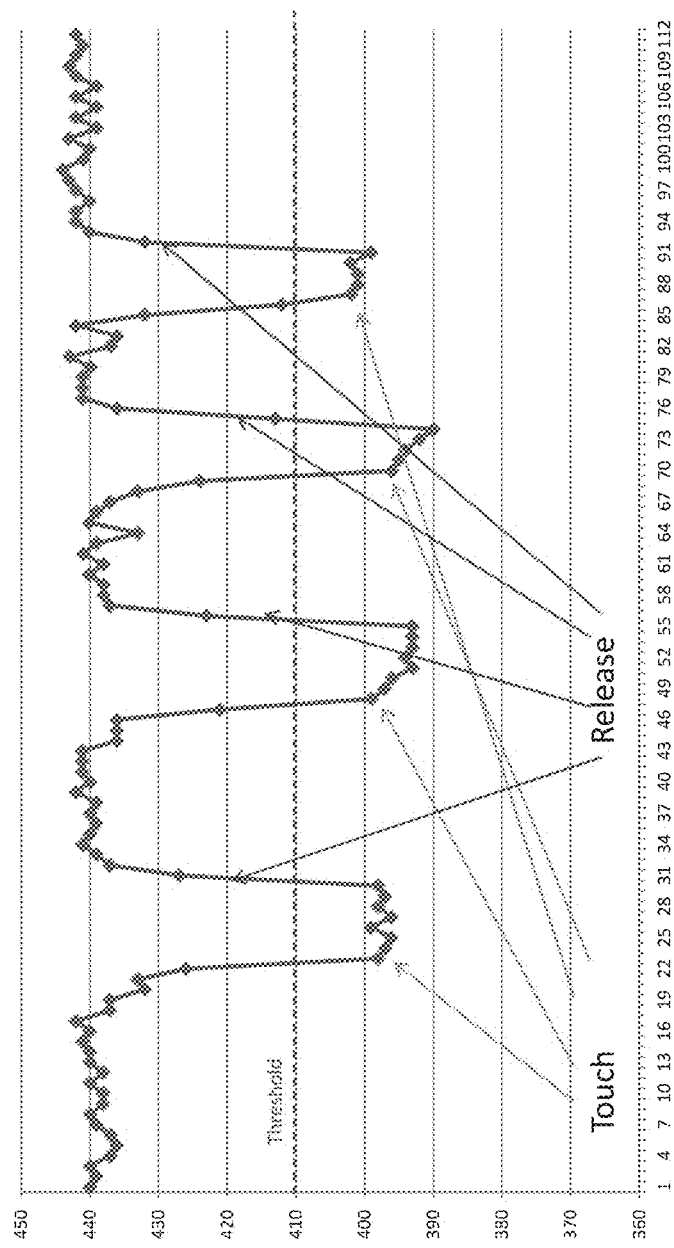
FIG. 3 is a graph showing the raw capacitive values associated with a capacitive touch sensor in untouched and touched states as a function of time.

FIG. 3 illustrates the response of a typical capacitive sensor to four distinct touch and release events as observed in the time domain. The horizontal axis of FIG. 3 represents units of time or samples, and the vertical axis represents raw counts. The vertical axis could represent other units indicative of capacitive sensor operation, as would be understood to one skilled in the art.

The capacitive sensor illustrated in FIG. 3 has a baseline raw count, that is, a count with no stimulus proximate or touching sensor electrode 12 or touch surface 20, of about 440. This raw count represents the parasitic capacitance $C_p$. At about sample 18, the raw count begins to drop from the baseline value. This drop in counts corresponds to the approach of stimulus S to sensor electrode 12 or touch surface 20 and the establishment of an additional capacitive coupling, for example, stimulus capacitance $C_s$, from sensor electrode 12, through stimulus S, to ground, as discussed above. As stimulus S gets closer to sensor electrode 12 or touch surface 20, the magnitude of the capacitive coupling through stimulus S increases, and the value of the raw count decreases.

At about sample 22, the raw count bottoms out at a first depressed value of about 395-400 counts. This sample corresponds to the initial touch of stimulus S to sensor electrode 12 or touch surface 20.

The raw count remains at about the first depressed value until about sample 30. The samples from sample 22 to sample 30 correspond to the maintained contact of stimulus S to sensor electrode 12 or touch surface 20.

At about sample 30, the raw count begins to increase from the first depressed value. This increase in counts corresponds to the withdrawal of stimulus S from sensor electrode 12 or touch surface 20 and the reduction of the additional capacitive coupling from sensor electrode 12, through stimulus S, to ground, as discussed above. As stimulus S gets farther from sensor electrode 12 or touch surface 20, the magnitude of the capacitive coupling through stimulus S decreases, and the value of the raw count increases.

At about sample 33, the raw count reverts to the baseline. The raw count remains at about the baseline until about sample 42. The samples from sample 33 to sample 42 correspond to the withdrawal of stimulus S from sensor electrode 12 or touch surface 20 by a sufficient distance such that sensor electrode 12 is no longer capacitively coupled (or is insignificantly capacitively coupled) through stimulus S to ground.

At about sample 42, the raw count again begins to drop from the baseline. At about sample 50, the raw count bottoms out at a second depressed value of about 390-395 counts. At about sample 54, the raw count begins to increase from the second depressed value. At about sample, 59, the raw count reverts to the baseline. This reduction, bottoming out, hold, increase, and reversion to the baseline represent a second approach, contact, hold, and withdrawal of stimulus S as described above.

A similar cycle is repeated two more times, as would be recognized by one skilled in the art.

FIG. 3 illustrates a touch threshold of about 410 counts (or 30 counts below the baseline) for the capacitive sensor represented therein. As such, a touch event is deemed to occur when the raw count falls below 410 counts. The touch threshold of 410 counts is provided for illustration only. The touch threshold could be selected as desired at any suitable value higher or lower than 410 counts for a particular application, as would be understood by one skilled in the art.

The touch threshold could be selected so that a touch event is deemed to occur when touch surface 20 is actually touched by a bare finger. Alternatively, the touch threshold could be selected so that a touch event is deemed to occur when touch surface 20 is actually touched by a gloved finger. Further, the touch threshold could be selected so that a touch event is deemed to occur when a bare or gloved finger is proximate, but not touching touch surface 20 (sometimes referred to as a "proximity event"). As discussed above, the additional capacitance resulting from proximity or touch of a bare finger to touch surface 20 typically would be substantially greater than the additional capacitance resulting from proximity or touch of a gloved finger to touch surface 20.

Systems, such as the one described above, that rely strictly on differences in raw count in order to deem whether or not a touch event has occurred have certain shortcomings. For example, a system that is tuned to detect touch by a bare finger might not be able to readily determine touch by a gloved finger because the additional capacitance resulting from proximity of the gloved finger to sensor electrode 12 or touch surface 20 is insufficient to alter the raw counts in excess of the touch threshold selected to detect touch by a bare finger. Although in some instances such a system could be tuned to detect touch by a gloved finger, the system so tuned might by unduly sensitive to touch or proximity by a bare finger. For example, a system that is tuned to deem a touch event to occur when a gloved finger touches touch surface 20 might also deem to a touch to occur when a bare finger is merely proximate, and not touching, touch surface 20.

In essence, the challenge lies in selecting a threshold low enough to detect touch by a gloved finger (which results in a relatively small additional capacitance and, therefore, a relatively small effect on the system capacitance) but at the same time high enough to not deem a touch to have occurred as a result of mere proximity (but not touch) of a stimulus to the touch surface, or as a result of noise, crosstalk, interference or other parasitic phenomena.

This challenge may be met by transforming the raw capacitance signals from the time domain to the frequency domain using any suitable transform technique, and then evaluating the transformed signals in the transformed signal bins. A Fast Fourier Transform ("FFT") is one suitable form of transform technique. An FFT, however, is relatively math intensive. For example, it involves multiplication and processing of complex numbers. Performing an FFT quickly enough to be useful in analyzing capacitive sensor signals and determining whether a touch event has occurred in real time requires the use of a relatively powerful, and relatively expensive, processor.

Alternatively, this challenge may be met by transforming the raw capacitance signals from the time domain to the sequency domain using, for example, a Walsh-Hadamard transform or a Fast Walsh-Hadamard transform, and then evaluating the transformed signals in the transformed signal bins. A Walsh-Hadamard transform can be performed using only basic addition and subtraction, and it does not involve the use of complex numbers. As such, performing a Walsh-Hadamard transform requires relatively little computing power compared to performing a Fast Fourier Transform (FFT). Indeed, in at least some applications, a Walsh-Hadamard transform could be performed using the microprocessor that might be included as part of a conventional capacitive sensor's control system. Also, because a Walsh-Hadamard transform involves relatively little computation, and because the computation is relatively simple, a Walsh-Hadamard transform can be performed relatively quickly.

Figure 4:
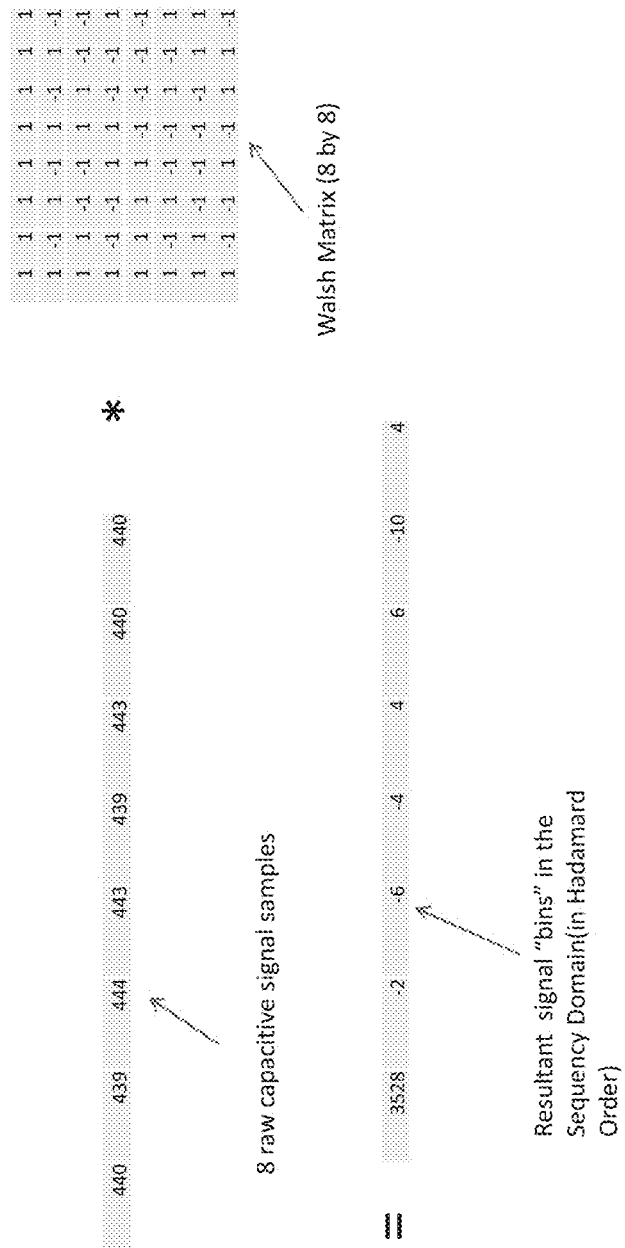
FIG. 4 illustrates the transformation of raw capacitive values for an eight sample sequence from the time domain to the sequency domain using a Walsh Hadamard Transform.

FIG. 4 illustrates a representative eight point sample of capacitive signal data as a function of time. The eight point rolling sample includes the most current sample, as well as the seven previous samples. (The most current sample shown in FIG. 4 corresponds to sample 1 of FIG. 3; the seven previous samples are not shown in FIG. 3.) The most current sample is in the rightmost position of the string illustrated in FIG. 4. The second-most current sample is immediately to the left of the most current sample. The third-most current sample is immediately to the left of the second-most current sample, and so on.

FIG. 4 also illustrates transform transformation of the eight point sample of capacitive signals from the time domain to the sequency domain using a Walsh-Hadamard transform by multiplying the eight point sample by an 8×8 Walsh matrix. The transformation yields eight transformed signals, as would be understood by one skilled in the art, and as discussed further below. The eight transformed signals fall into eight corresponding signal bins in the sequency domain. FIG. 4 illustrates the signal bins arranged in Hadamard order, which represents the sequency data in directly output from the transform. (The use of an eight point sample and 8×8 Walsh matrix is illustrative. As discussed further below, a Walsh-Hadamard transform may be performed on a rolling sample of any length or size n by multiplying the sample by a correspondingly sized (n×n) Walsh matrix, where $n=2^x$ and x is an integer greater than or equal to than 2.)

Figure 5:
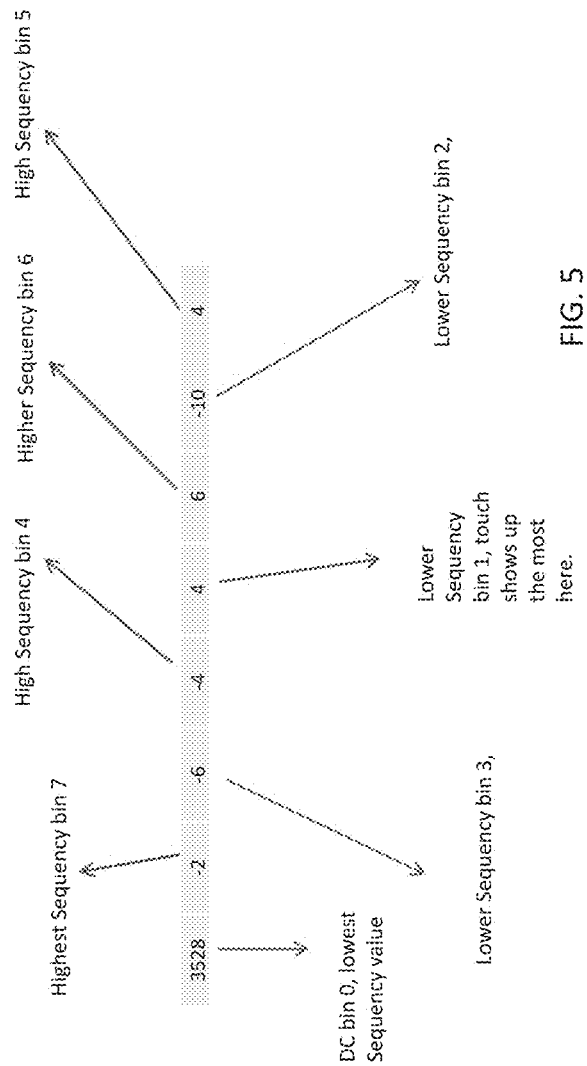
FIG. 5 illustrates the sequency bins yielded by the Walsh Hadamard Transform illustrated in FIG. 4.

FIG. 5 illustrates how the signal bins could be arranged in sequency order, that is, in the order of increasing sequency. As best shown in FIG. 5, the left-most signal bin is defined as sequency bin 0. The second sequency bin from the left is defined as sequency bin 7. The third sequency bin from the left is defined as sequency bin 3. The fourth sequency bin from the left is defined as sequency bin 4. The fifth sequency bin from the left is defined as sequency bin 1. The sixth sequency bin from the left is defined as sequency bin 6. The seventh sequency bin from the left is defined as sequency bin 2. The eighth sequency bin from the left is defined as sequency bin 5.

Multiplying the eight point sample by the 8×8 Walsh matrix involves adding and subtracting the data values for each point in the sample according to the signs in each row of the matrix. For example, the value of sequency bin 0 is computed by adding together the values of each point of the eight point string as dictated by the first row of the Walsh matrix. The value of sequency bin 7 is computed by adding the values of the first, third, fifth and seventh points and subtracting the values of the second, fourth, sixth and eighth points of the eight point string as dictated by the second row of the Walsh matrix. The value of sequency bin 3 is computed by adding the values of the first, second, fifth and sixth points and subtracting the values of the third, fourth, seventh and eighth points of the string as dictated by the third row of the Walsh matrix. The value of sequency bin 4 is computed by adding the values of the first, fourth, fifth and eighth points and subtracting the values of the second, third, sixth and seventh points as dictated by the fourth row of the Walsh matrix. The values of the remaining sequency bins are bins are computed in a similar manner, as dictated by the corresponding rows of the Walsh matrix, and as would be understood by one skilled in the art.

Once a particular eight point sample has been transformed, as discussed above, the next eight point sample is transformed in a similar manner Once the next eight point sample has been transformed, the following eight point sample is transformed, and so on. As such, the method involves substantially continuous transformation of an eight point rolling sample, with each eight point rolling sample including the then most current sample and the seven immediately preceding samples.

Figure 6:
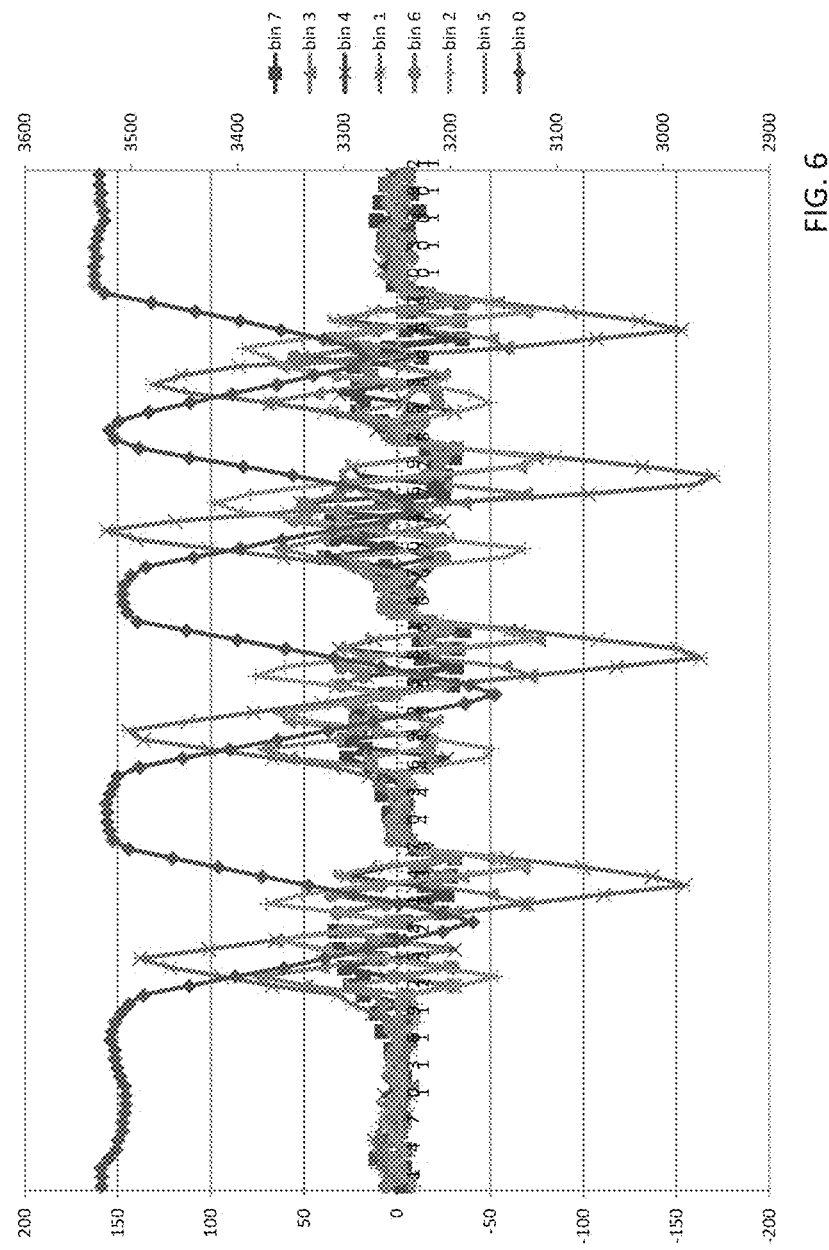
FIG. 6 illustrates capacitive touch in the sequency domain as a function of the eight sequency bins illustrated in FIG. 3.

FIG. 6 illustrates the capacitive signal data of FIG. 3 after having been transformed, using an eight point rolling sample window to yield the signal expanded into the eight sequency bins, as discussed above.

Figure 7:
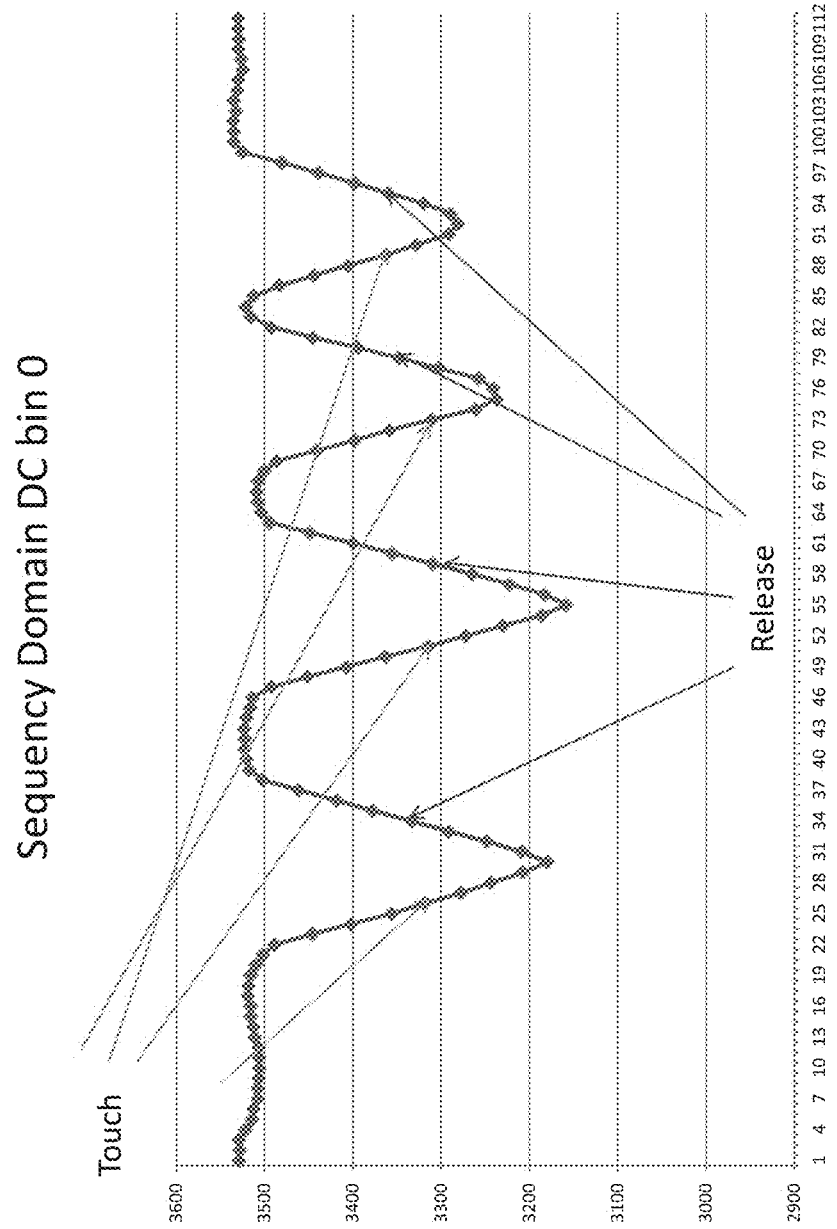
FIG. 7 illustrates the sequency domain distribution curve associated with sequency bin 0.

FIG. 7 illustrates a distribution curve for the signal components in sequency bin 0. This distribution curve represents the area under the curve of FIG. 3 (which represents the raw capacitive count at each sample in the time domain) for each eight point rolling sample upon which the Walsh-Hadamard transform has been performed. For example, the count value of 3528 at sample point 1 of FIG. 7 represents the sum of the counts for the rolling sample including sample 1 of FIG. 3 and the seven immediately preceding samples (which are not shown in FIG. 3). Similarly, the count value of 3527 at sample point 2 of FIG. 7 represents the sum of the counts for the rolling sample including sample 2 of FIG. 3 and the seven immediately preceding samples (six of which are not shown in FIG. 3). Further, the count value of 3508 at sample point 8 of FIG. 7 represents the sum of the counts for the rolling sample including sample 8 of FIG. 3 and the seven immediately preceding samples (that is, samples 1-7), and so on.

The distribution curve of FIG. 7 is similar to the curve of FIG. 3 in that it shows a baseline count (about 3500 counts), decreasing counts (down to about 3200-3300 counts) in response to a touch, and increasing counts in response to release of the touch. More specifically, the downward sloping portions of the curve represent the system response to a touch, and the upwardly sloping portions of the curve represent the system response to release of the touch.

According to a first method, the data of sequency bin 0 could be used to determine whether a touch event has occurred in a manner similar to that in which raw capacitance data is used to determine whether a touch event has occurred in the time domain. More particularly, a threshold representing a difference in counts from the baseline could be established and a touch could be deemed to have occurred when the counts are less than the threshold (or otherwise deviate from the baseline by more than a threshold amount). Similarly, a release could be deemed to have occurred when the counts return to a value above the threshold (or to the baseline value or a value that deviates from the baseline by less than a threshold amount (which may the same as, greater than, or less than the threshold mound used to determine whether a touch has occurred)). In one example, the threshold could be 240 counts, which represents eight times the thirty count time domain threshold illustrated in FIG. 3. The multiplier of eight used here is a function of the eight point sample size. In other embodiments, other thresholds could be established, which thresholds could, but need, be a function of the time domain threshold or the sample size used in performing the Walsh-Hadamard transform as discussed herein. Because this means of determining whether a touch event has occurred is based on eight samples, rather than a single sample as is the case in the time domain, this means has a better signal-to-noise ratio than the time domain means.

Figure 8:
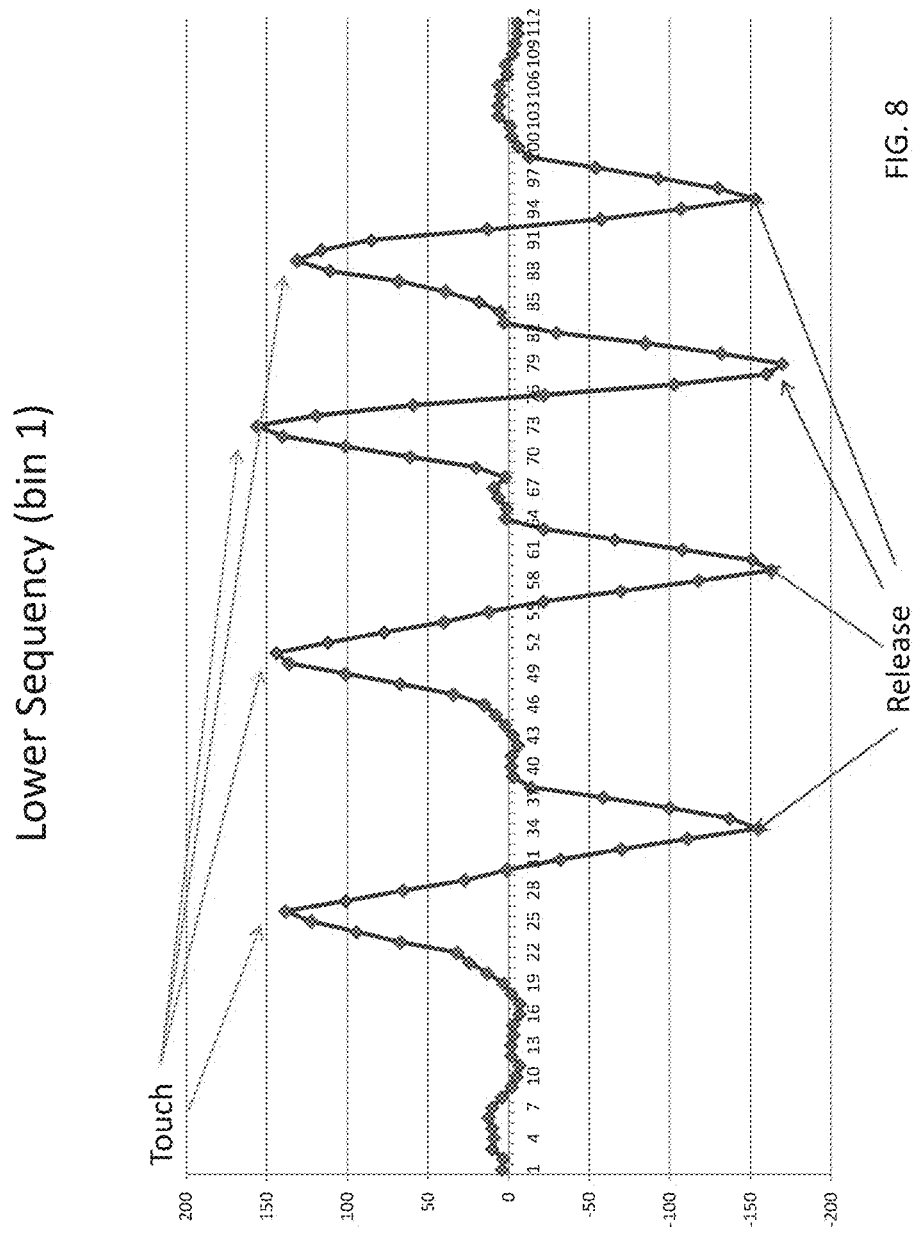
FIG. 8 illustrates the sequency domain distribution curve associated with sequency bin 1.

FIG. 8 illustrates a distribution curve for sequency bin 1. This distribution curve shows a count hovering about a baseline of about zero counts, a positive excursion to a maximum of about 150 counts, a negative excursion to a minimum of about −150 counts, and a positive excursion back to the baseline. This or a substantially similar cycle is repeated four times, corresponding to the four touch and release events illustrated in the time domain in FIG. 3.

In FIG. 8, the baseline about zero represents the untouched condition, each rise in counts from the baseline to the positive peak represents approach of a stimulus to a sensor electrode or touch surface, each positive peak and fall from the positive peak to the negative peak represents touch of the stimulus, and each negative peak and the rise from the negative peak to the baseline represents release of the stimulus. As such, FIG. 8 represents four taps and releases of stimulus S to and from sensor electrode 12 or touch surface 20.

Figure 9:
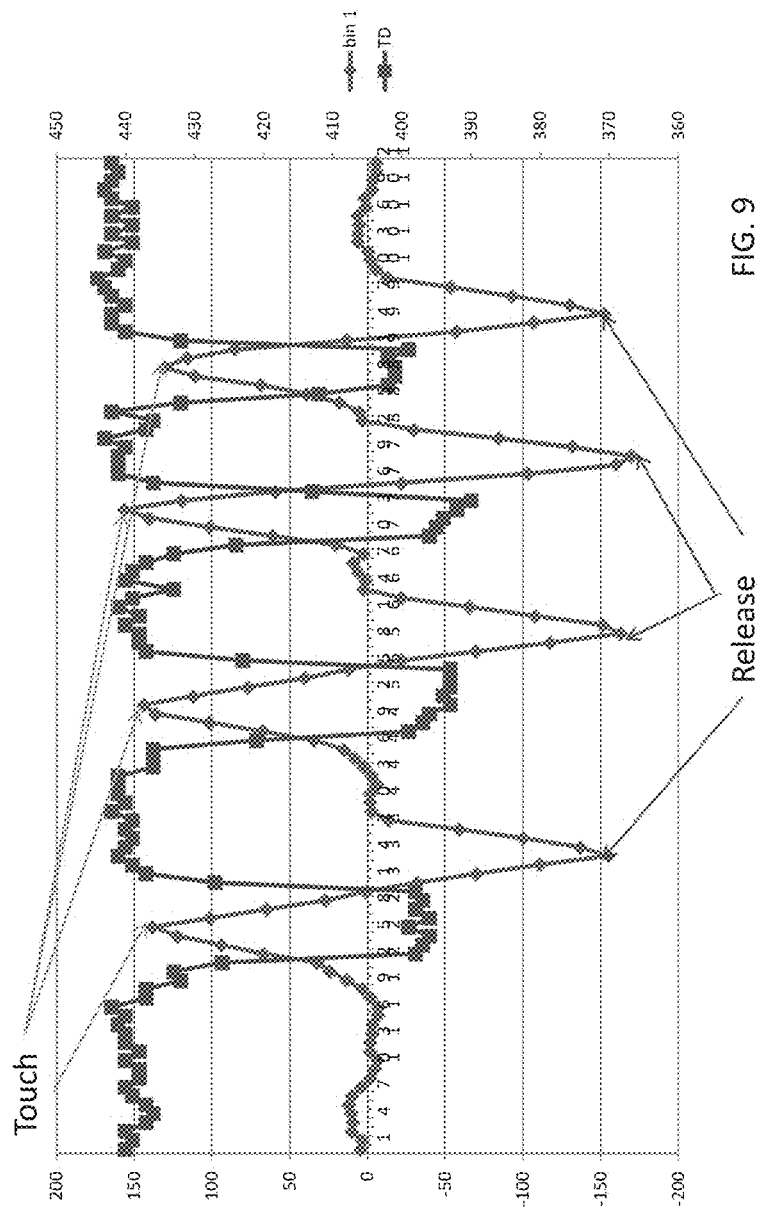
FIG. 9 illustrates the sequency domain distribution curve associated with sequency bin 1 as illustrated in FIG. 8 superimposed upon the time domain signal illustrated in FIG. 3.

FIG. 9 illustrates the distribution curve of FIG. 8 superimposed onto the time domain signal of FIG. 3.

With reference to FIG. 8, according to a second method, the data of sequency bin 1 could be used in several ways to determine whether a touch event has occurred. For example, a touch could be deemed to have occurred when the previous bin sample is greater than the current bin sample, preferably by at least a predetermined amount or threshold. With reference to FIG. 8, a touch could be deemed to have occurred at sample point 27 because the count at previous sample point 26 is greater than the count at sample point 27. (The touch event would actually have occurred at sample point 26, where the raw count reaches a maximum.) Similarly, a touch would not be deemed to have occurred at sample point 26 because the count at the previous sample point, namely, sample point 25, is not greater than the count at sample point 26.

According to the second method, the data of sequency bin 1 could be used to determine that a release event has occurred when the count has gone negative and the current sample is greater than the previous sample. With reference to FIG. 8, a release could be deemed to have occurred at sample point 35 because the count is negative and the count at sample point 34 is greater than the count at immediately previous sample point 33. (The release would actually have occurred at sample point 33, where the count reaches a minimum.)

With continued reference to FIG. 8, according to a third method, a touch could be deemed to have occurred when the counts of sequency bin 1 cross zero in the positive direction and then cross zero in the negative direction. A release could be deemed to have occurred when the counts of sequency bin 1 cross zero in the negative direction and then cross zero in the positive direction.

The flat portion of the curve of FIG. 8 between the four touch and release events (that is, between adjacent negative peaks and positive peaks) represents a no-touch condition. Though the phenomenon is not illustrated in FIG. 8, a held touch could be evidenced by a count about zero and between a leading positive peak and a following negative peak.

With continued reference to FIG. 8, according to a fourth method, a touch could be deemed to have occurred when the value of the current sequency bin 1 signal and the value of the previous sequency bin 1 signal differ by more than a predetermined positive threshold amount. This phenomenon may be represented by a positive slope of the curve between samples points of sequency bin 1. A release could be deemed to have occurred when the value of the current sequency bin 1 signal and the value of the previous sequency bin 1 signal differ by more than a predetermined negative threshold amount. This phenomenon may be represented by a negative slope of the curve between samples points of sequency bin 1.

Figure 10:
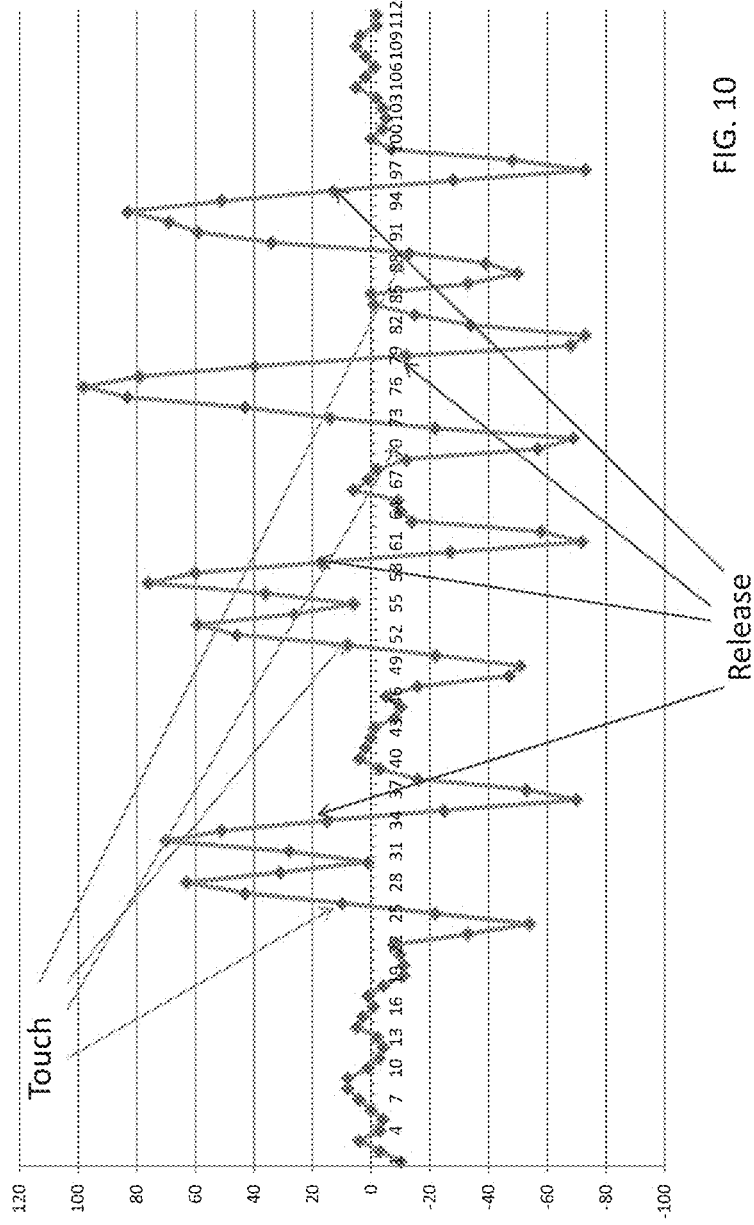
FIG. 10 illustrates the sequency domain distribution curve associated with sequency bin 2.

FIG. 10 illustrates a distribution curve for sequency bin 2. This distribution curve shows counts hovering about a baseline of about zero counts, a negative excursion to about −55 counts, a positive excursion to about 60 counts, a second negative excursion to about zero counts, a second positive excursion to about 70 counts, a third negative excursion to about −70 counts, and a third positive excursion to about the baseline. This or a substantially similar cycle is repeated four times, corresponding to the four touch and release events illustrated in the time domain in FIG. 3.

Figure 11:
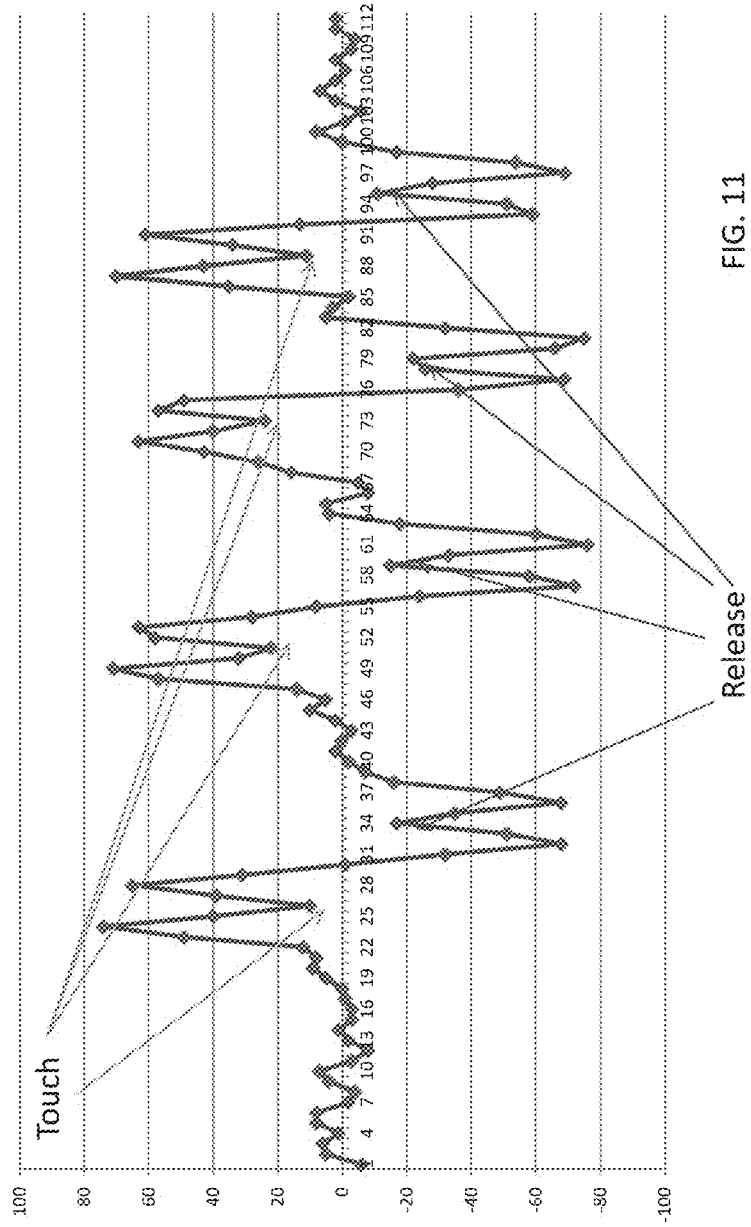
FIG. 11 illustrates the sequency domain distribution curve associated with sequency bin 3.
Figure 12:
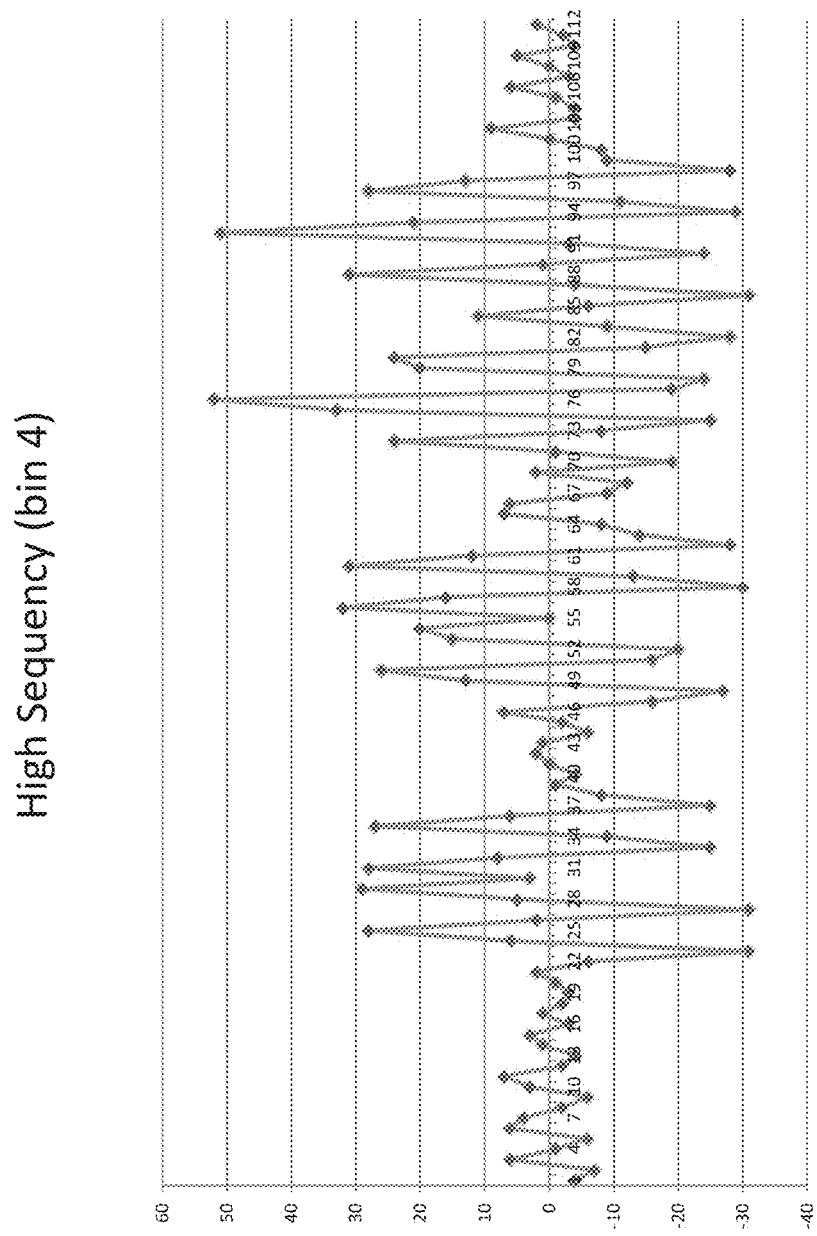
FIG. 12 illustrates the sequency domain distribution curve associated with sequency bin 4.
Figure 13:
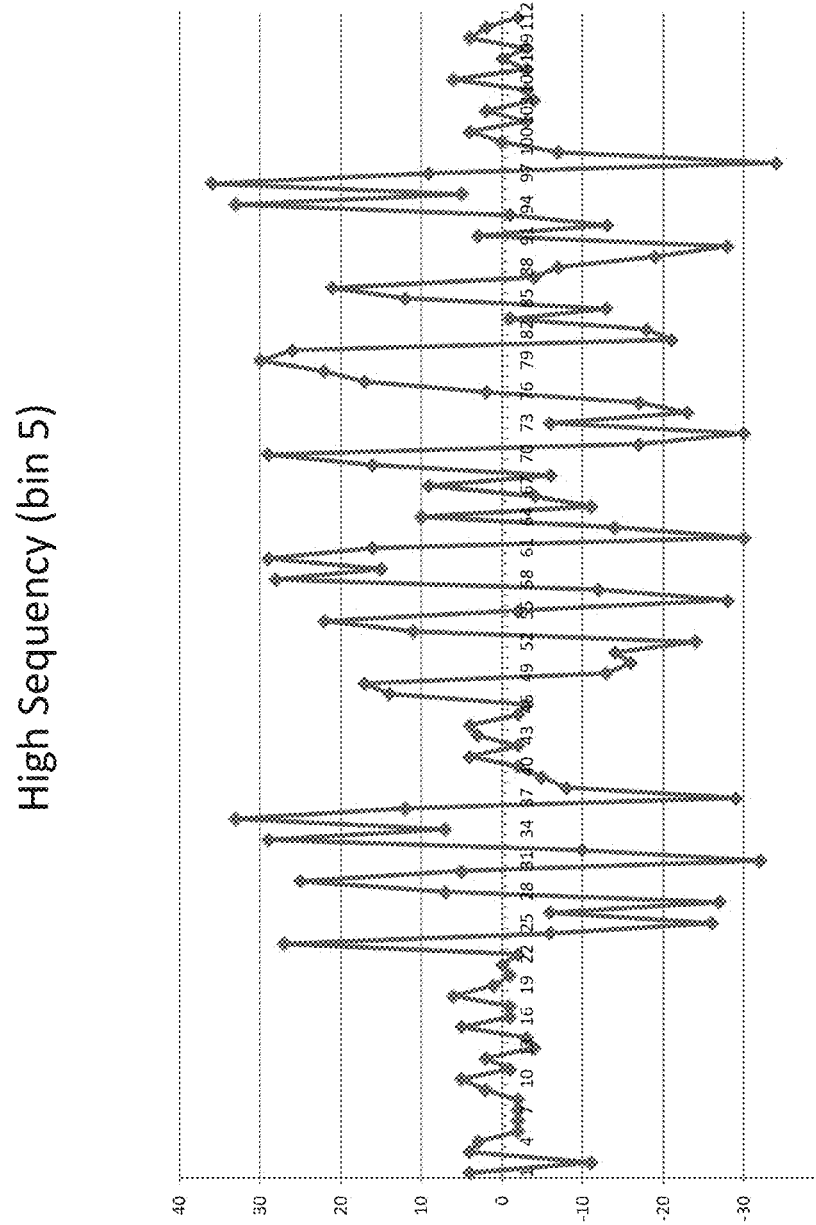
FIG. 13 illustrates the sequency domain distribution curve associated with sequency bin 5.
Figure 14:
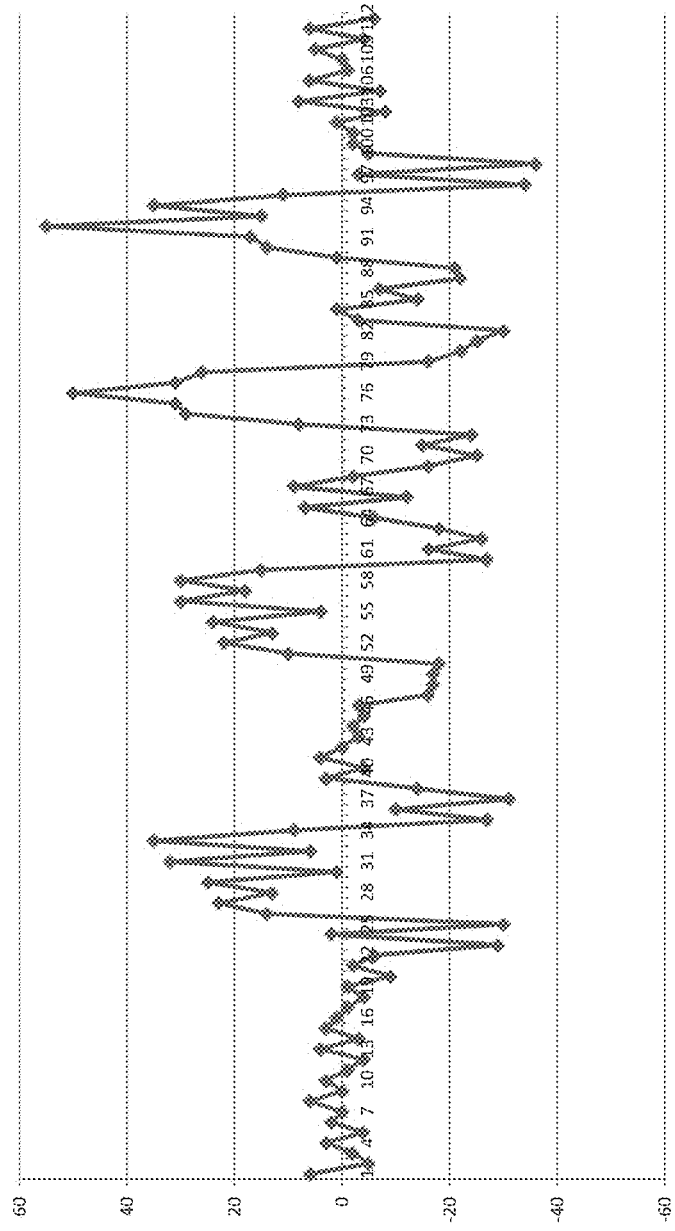
FIG. 14 illustrates the sequency domain distribution curve associated with sequency bin 6.
Figure 15:
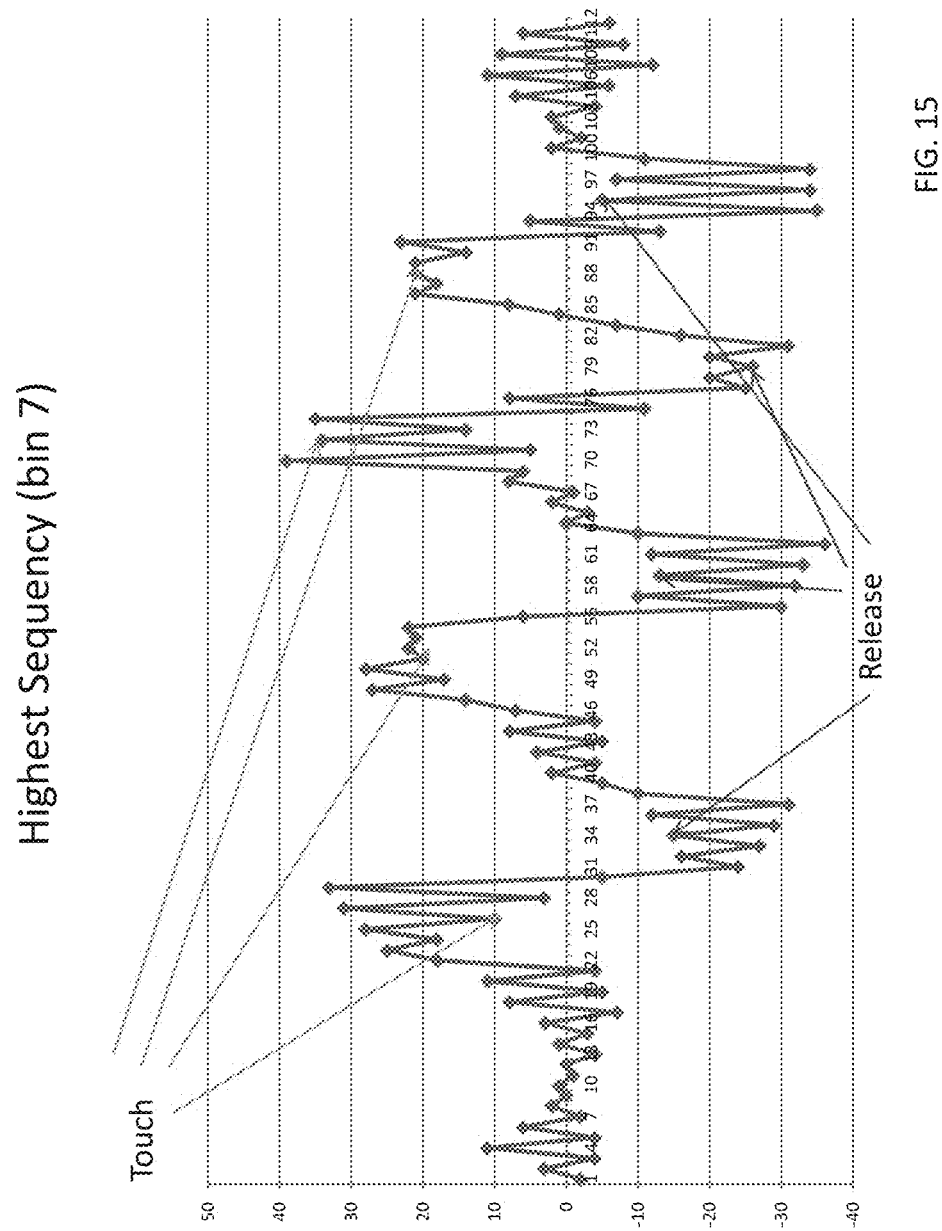
FIG. 15 illustrates the sequency domain distribution curve associated with sequency bin 7.

FIG. 11 illustrates a distribution curve for sequency bin 3. This distribution curve shows a count hovering about a baseline of about zero counts, a positive excursion to about 75 counts, a negative excursion to about ten counts, a second positive excursion to about 65 counts, a second negative excursion to about −70 counts, a third positive excursion to about −15 counts, a third negative excursion to about −70 counts, and a fourth positive excursion to about zero counts. This or a substantially similar cycle is repeated four times, corresponding to the four touch and release events illustrated in the time domain in FIG. 3.

FIGS. 12-15 illustrate distribution curves for sequency bins 4-7, respectively. Each of these figures illustrates a count hovering about a baseline of about zero counts, and a number of positive and negative excursions thereafter.

Figure 16:
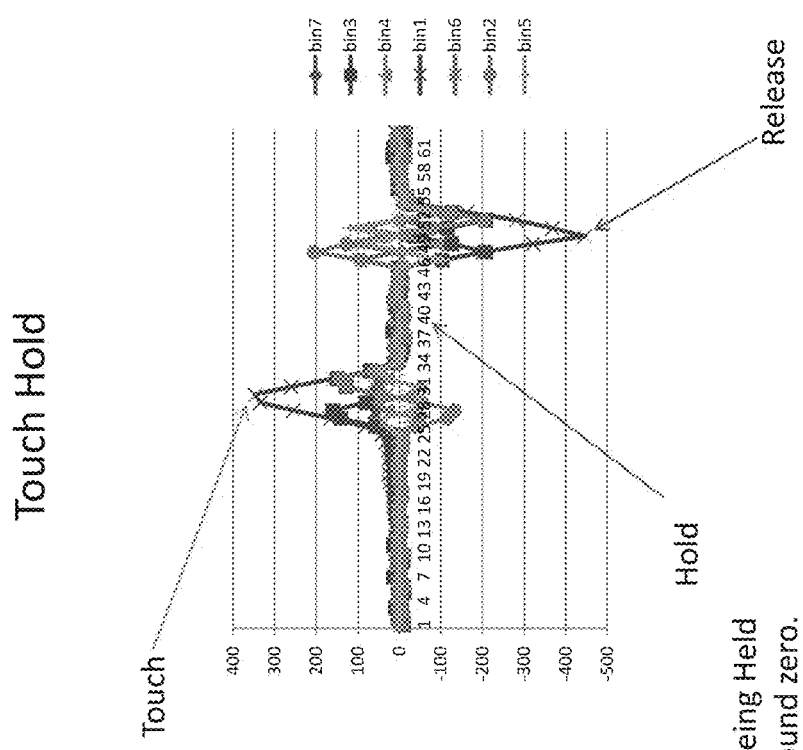
FIG. 16 illustrates the sequency domain distribution curve associated with sequency bins 1-7 superimposed on each other over the course of a no-touch condition followed by a touch event, which is followed by a hold event, which is followed by a release event.

FIG. 16 illustrates the signals of sequency bins 1-7 superimposed on each other, and identifies a no-touch condition, a touch event, a hold event, and a release event.

The signal data from the higher sequency bins (bins 2-7) could be useful in determining whether a touch event has occurred. For example, according to a fifth method, a touch may be deemed to have occurred when the signals in bins 1, 2, 3, 7 and 6 are above zero and the signals in bins 4 and 5 are below zero. Similarly, a release may be deemed to have occurred when the signals in bins 1, 2, 3, 7 and 6 are below zero and the signals in bins 4 and 5 are above zero. These situations are illustrated in FIG. 16.

Figure 17:
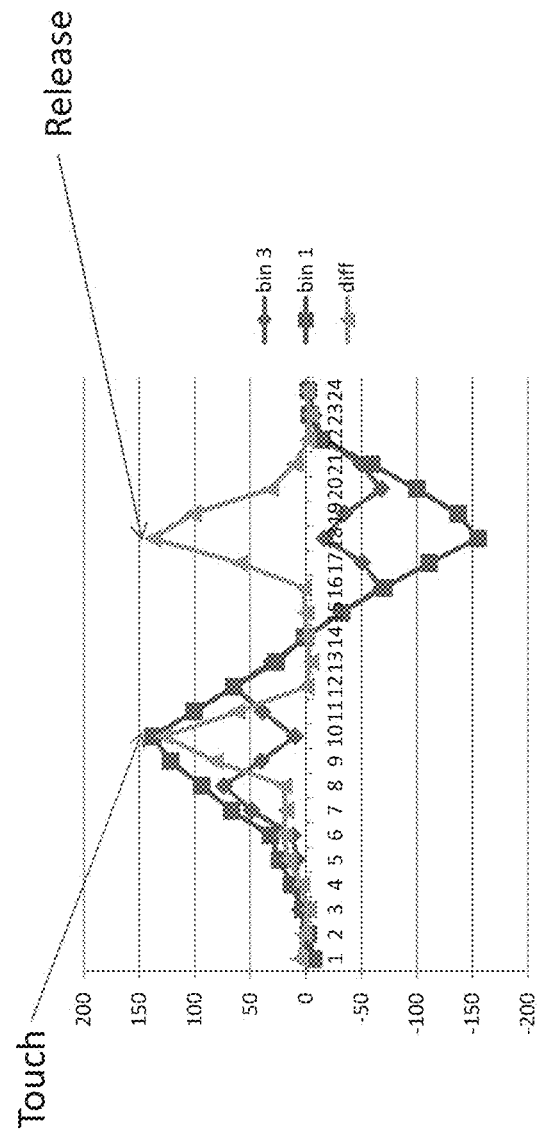
FIG. 17 illustrates the sequency domain distribution curves associated with sequency bins 1 and 3 and a distribution curve showing the difference between the distribution curves associated with bins 1 and 3 at each sample point superimposed on each other during touch and release events.

Also, according to a sixth method, a touch may be deemed to have occurred when the difference between the values of bins 1 and 3 is greater than a predetermined threshold, the value of bin 3 is less than another predetermined threshold, and the value of bin 1 is greater than zero. The predetermined thresholds used in the touch analysis may be the same or different and either may be greater or lesser than the other. A release may be deemed to have occurred when the difference between the values of bins 1 and 3 is greater than a predetermined threshold, the value of bin 3 is less than another predetermined threshold, and the value of bin 1 is less than zero. The predetermined thresholds used in the release analysis may be the same or different and either may be greater or lesser than the other. The predetermined thresholds used in the touch analysis may be the same as or different from the predetermined thresholds used in the release analysis. This situation is illustrated in FIG. 17.

Figure 18:
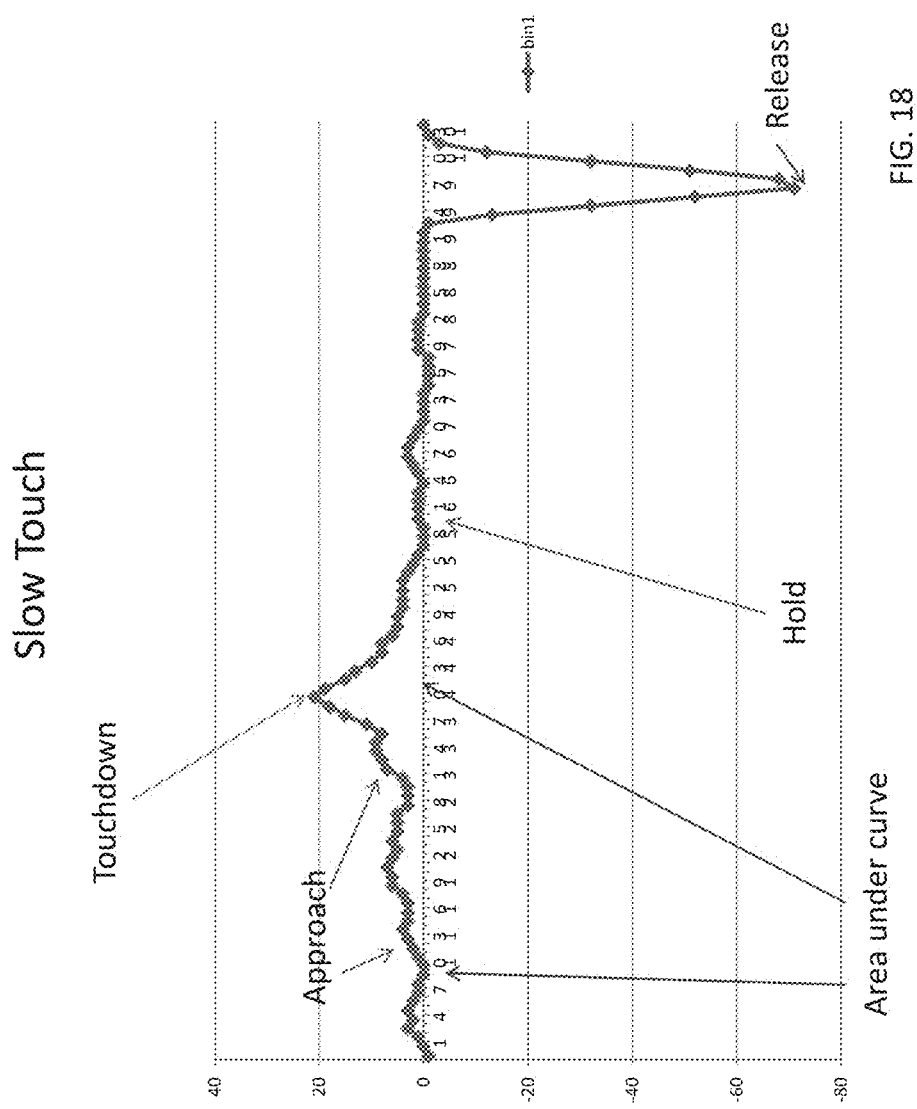
FIG. 18 illustrates the sequency domain distribution curve associated with sequency bin 1 during a slow touch event.

FIG. 18 illustrates the signals of sequency bin 1 and identifies a slow touch, a hold and a normal (rather than slow) release. "Slow" as used in this context refers to actions that are relatively gradual as opposed to relatively abrupt. For example, "slow touch" and "slow release" may refer, respectively, to a gradual approach of a stimulus to and gradual removal of a stimulus from touch surface 20 or sensor electrode 12, rather than a quick, relative abrupt tap and release of a stimulus thereto.

Detection of a slow touch or release event using capacitive data in the time domain may be difficult based on the manner in which the capacitive reference that is used in conjunction with a capacitive threshold in order to determine whether a touch or proximity event has occurred typically is established, used, and/or maintained. Conventional capacitive systems may include means to continuously adjust the capacitive reference to compensate for temperature fluctuations, noise, and contamination that may build up on the touch surface or sensor electrode over time, all of which can affect and alter the baseline capacitance, i.e., the raw capacitance in the absence of a stimulus proximate the touch surface or sensor electrode.

For example, airborne contaminants may become deposited on and build up upon the touch surface over time. Such contaminants can cause the baseline capacitance to increase or decrease. If the baseline capacitance decreases, the additional capacitance provided by introduction of a stimulus to the touch surface might be insufficient to exceed the raw capacitance threshold so that a touch event is deemed to have occurred. For example, the baseline capacitance at a given time might be 400 counts, and the capacitive reference might be set at 400 raw counts based on this baseline capacitance. Introduction of a stimulus might increase the raw capacitance by 40 counts. A designer might select a touch threshold of 435 counts so that a touch is deemed to occur in response to introduction of the stimulus, even if the baseline capacitance fluctuates by a few counts from the initial baseline capacitance of 400 counts. If the baseline capacitance were to drop to 390 counts, however, and introduction of the stimulus were to increase the raw capacitance by 40 counts to a total of 430 counts, the touch threshold would not be met or exceeded, and a touch would not be deemed to occur.

The converse result could occur if the baseline capacitance were to increase due to such effects. More specifically, if the baseline were to increase to 420 counts, an increase in capacitance of as little as 16 counts would yield a total capacitance in excess of the touch threshold. As such, the system could deem a touch event to have occurred when a stimulus is brought near the touch surface or sensor electrode, but not as close as the designer might have intended in order for the system to deem a touch event to have occurred.

Conventional systems may compensate for such effects by dynamically adjusting the reference capacitance in response to time-averaged fluctuations in the baseline capacitance. For example, the system may be configured to recognize a slowly increasing or decreasing baseline capacitance over time and dynamically adjust the reference capacitance and touch threshold accordingly, as would be understood by one skilled in the art. Such dynamic reference adjustment systems, however, might not be able to distinguish between "normal" fluctuations in the baseline and slow increases or decreases in raw capacitance resulting from a slow but deliberate introduction of a stimulus proximate the touch surface or sensor electrode. As such, a conventional dynamic reference adjustment system might continuously adjust the reference capacitance up or down as a consequence of the slow introduction of a stimulus such that the system does not recognize or respond to a legitimate touch event. Put another way, rather than recognizing a steadily increasing or decreasing raw count as resulting from an approaching stimulus, the system may consider the change in raw count as resulting from the effects of temperature, noise, or contaminants, and it may adjust the reference and threshold accordingly, such that the threshold is not exceeded in response to the stimulus.

According to a seventh method, slow touch and release events can be detected in the sequency domain by integrating transformed data over time as described further below and comparing the integrated value to corresponding thresholds to determine whether a touch or release event has occurred. More particularly, a slow touch event can be detected by integrating the transformed values of successive samples in sequency bin 1 having transformed values greater than zero, resetting the integrated value to zero in response to a sample having a transformed value less than zero, and deeming a touch event to have occurred if and when the integrated value exceeds a predetermined threshold. Similarly, a slow release event can be detected by integrating the transformed values of successive samples in sequency bin 1 having transformed values less than zero, resetting the integrated value to zero in response to a sample having a transformed value above zero, and deeming a touch event to have occurred if and when the absolute value of the integrated value exceeds a predetermined threshold.

For example, with reference to FIG. 18, the transformed data from sample 1 to sample 12 fluctuates positively and negatively about (above and below) the baseline of zero counts. The values of successive samples having positive values are added (integrated) and the resulting integration is reset to zero when a sample having a negative value is encountered. Similarly, the values of successive samples having negative values are integrated and the resulting integration is reset to zero when a sample having a positive value is encountered.

More specifically, from sample 1 to sample 8, the transformed values are positive and are added (integrated). At sample 9, the transformed value is negative, and the integration is reset to zero. Because the integration was reset to zero before the threshold was achieved, no touch event is deemed to have occurred between samples 1 and 8.

From sample 9 to sample 11, the transformed values are negative and are added. At sample 12, the transformed value goes positive and the integration is reset to zero. Because the integration was reset to zero before the threshold was achieved, no release event is deemed to have occurred between samples 9 and 11.

At sample 12, the transformed values of successive samples begin to increase and remain above zero, yielding integration values as set forth in the following chart:

|  | Sample | | | | | | | | | | | | | | | | |
|---|---|---|---|---|---|---|---|---|---|---|---|---|---|---|---|---|---|
|  | 12 | 13 | 14 | 15 | 16 | 17 | 18 | 19 | 20 | 21 | 22 | 23 | 24 | 25 | 26 | 27 | 28 |
| Count | 1 | 2 | 3 | 4 | 3 | 3 | 3 | 4 | 6 | 6 | 7 | 6 | 5 | 6 | 5 | 5 | 5 |
| Integration | 1 | 3 | 6 | 10 | 13 | 16 | 19 | 23 | 29 | 35 | 42 | 48 | 53 | 59 | 64 | 69 | 74 |

|  | Sample | | | | | | | | | | | | | |
|---|---|---|---|---|---|---|---|---|---|---|---|---|---|---|
|  | 29 | 30 | 31 | 32 | 33 | 34 | 35 | 36 | 37 | 38 | 39 | 40 | 41 | 42 |
| Count | 3 | 3 | 3 | 4 | 7 | 8 | 9 | 9 | 8 | 11 | 15 | 18 | 21 | 19 |
| Integration | 77 | 80 | 83 | 87 | 94 | 102 | 111 | 120 | 128 | 139 | 154 | 172 | 193 | 212 |

At sample 42, the integration of successive samples reaches 212 counts. Assuming for the sake of illustration that the touch threshold is set at 200 counts, the integration at sample 42, therefore, exceeds the touch threshold and a touch is deemed to have occurred at sample 42 and not earlier. At sample 43, the transformed values of successive samples begins to decrease. At sample 58, the transformed value goes negative, and the integration is reset to zero. Between sample 59 and sample 95, the transformed values fluctuate about the baseline of zero such that the integration is frequently reset to zero before a threshold is reached. As such, between samples 59 and 95, neither a touch event nor a release event is deemed to have occurred.

At sample 96, the transformed values of successive samples begin to decrease from zero and remain below zero, yielding integration values as set forth in the following chart:

|  | Sample | | | | | |
|---|---|---|---|---|---|---|
|  | 96 | 97 | 98 | 99 | 100 | 101 |
| Count | −1 | −13 | −32 | −52 | −71 | −68 |
| Integration | −1 | −14 | −46 | −98 | −169 | −237 |

At sample 101, the absolute value of the integration of successive samples reaches 237 counts. Assuming for the sake of illustration that the release threshold is set at 200 counts, the integration at sample 101, therefore, exceeds the release threshold and a release event is deemed to have occurred at sample 101 and not earlier. At sample 102, the transformed value begins to increase. At sample 105, the transformed value goes positive, and the integration is reset to zero. (The release illustrated in FIG. 18 is a relatively abrupt, and not a slow, release. The foregoing principles, however, could be used to detect a slow release. Similarly, these principles also could be used to detect an abrupt touch.)

The principles of the disclosure could be applied to determine touch based on noise. For example, a current system noise level may be determined by summing the absolute values of bins 4, 5 6, and 7 for a given sample and the previous sample (or by summing the absolute values of bins numbered n/2 through n−1 in applications involving rolling samples of sizes n other than eight and correspondingly-sized Walsh matrices wherein application of the Walsh Hadamard Transform to the rolling sample yields data in sequency bins 0 through n−1). This noise level determination is dynamic in that it is recalculated as the eight rolling sample indexes, as discussed above.

Figure 19:
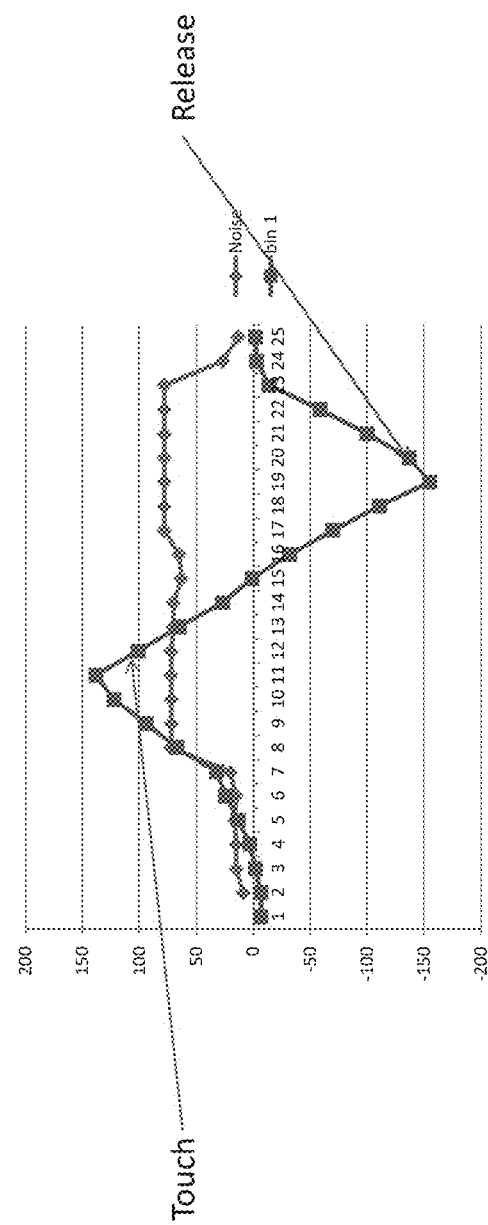
FIG. 19 illustrates the sequency domain distribution curve associated with sequency bin 1 and the absolute summation of the sequency domain distribution curves associated with sequency bins 4-7 superimposed on each other during touch and release events.

According to an eighth method, a touch may be deemed to have occurred when the value of bin 1 reaches a positive peak greater than a predetermined threshold that may be calculated as a function of the current noise level. For example, the threshold may be calculated by multiplying the current noise level by a value greater or less than 1. In an embodiment, this multiplier may have a value of ⅔. A release may be deemed to have occurred when the value of bin 1 reaches negative peak greater than the same or another predetermined threshold that may be calculated in a similar manner. These situations are illustrated in FIG. 19.

Figure 20:
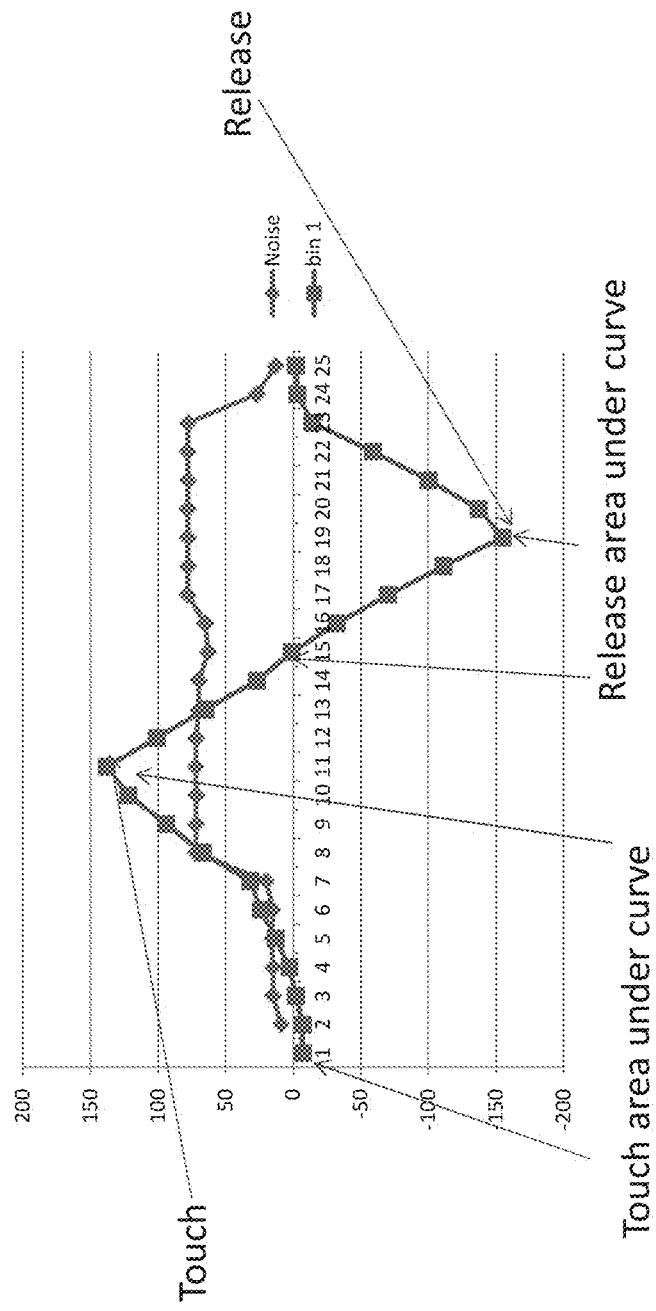
FIG. 20 illustrates the sequency domain distribution curve associated with sequency bin 1 and the absolute summation of the sequency domain distribution curves associated with sequency bins 4-7 superimposed on each other during touch and release events.

According to a ninth method, the foregoing noise threshold technique may be used in combination with the integration technique discussed above. Again, a current noise level may be determined by summing the absolute values of bins 4, 5 6, and 7 (or by summing the absolute values of bins numbered n/2 through n−1 in applications involving rolling samples of sizes n other than eight and correspondingly-sized Walsh matrices as discussed above) for a given sample and the previous sample. A touch may be deemed to have occurred when the positive integration of the values in bin 1 between points having zero or negative values is greater than a predetermined threshold that may be calculated as a function of the current noise level, for example, a multiple or ratio of the current noise level. A release may be deemed to have occurred when the negative integration of the values in bin 1 between points having zero or positive values is greater than a predetermined threshold that may be calculated as a function of the current noise level, for example, a multiple or ratio of the current noise level. These situations are illustrated in FIG. 20.

Figure 21:
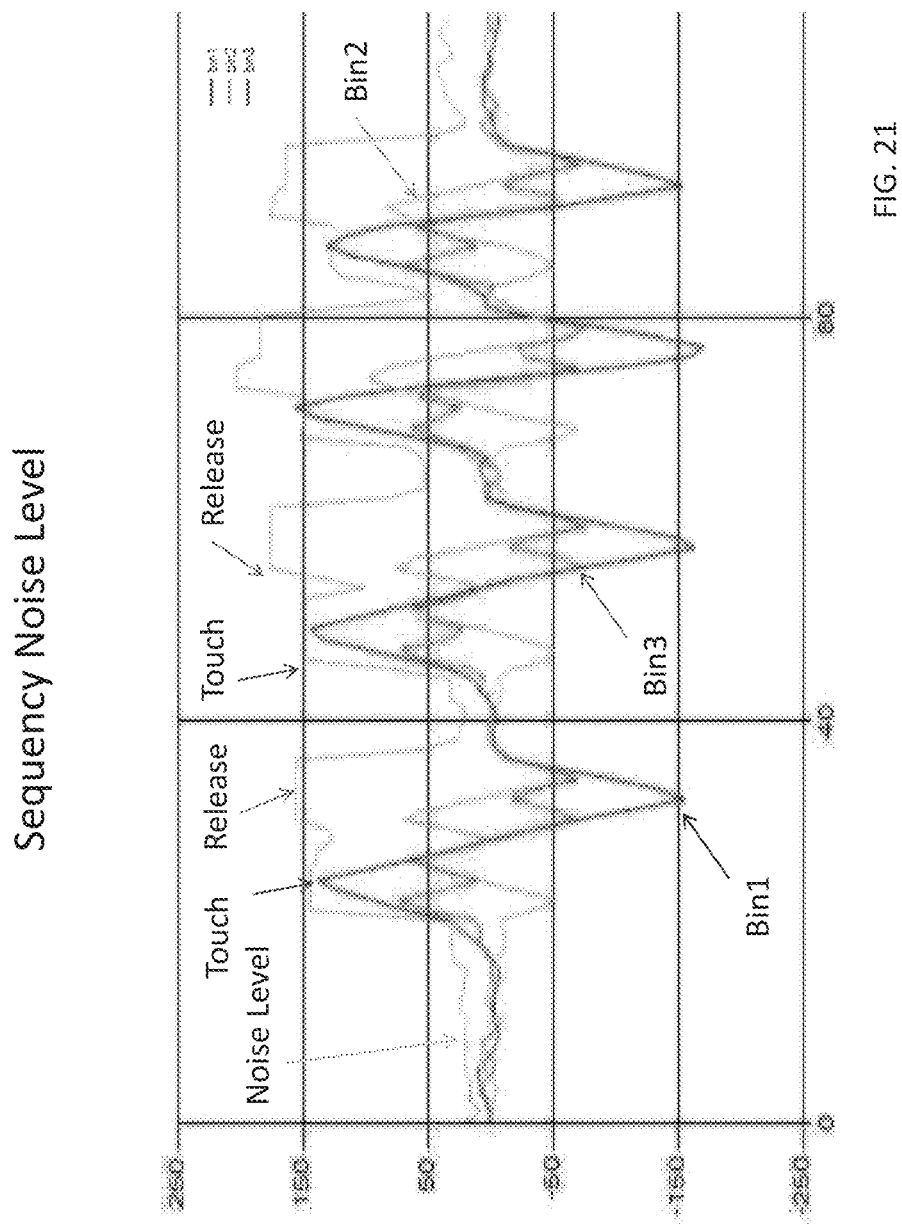
FIG. 21 illustrates the sequency domain distribution curves associated with sequency bins 1-3 and the absolute summation of the sequency domain distribution curves associated with sequency bins 4-7 superimposed on each other during touch and release events.

According to a tenth method, the dynamic noise level itself may be used to determine touch based on a comparison of the current noise level to the previous noise level. Noise typically is at a minimum or relatively low in the untouched state and the hold state. Noise increases in response to touch and also in response to a release. Noise associated with a release typically is greater than noise associated with a touch. A touch may be deemed to have occurred when the noise level increases above a predetermined threshold. A release may be deemed to have occurred when the noise level drops or by a second increase in noise level, possibly greater than the noise level indicative of the touch (because releases generally involve higher noise levels than touches). These situations are illustrated in FIG. 21, where the dips in the noise curve between the touch and release points correspond to momentary holds.

Figure 22:
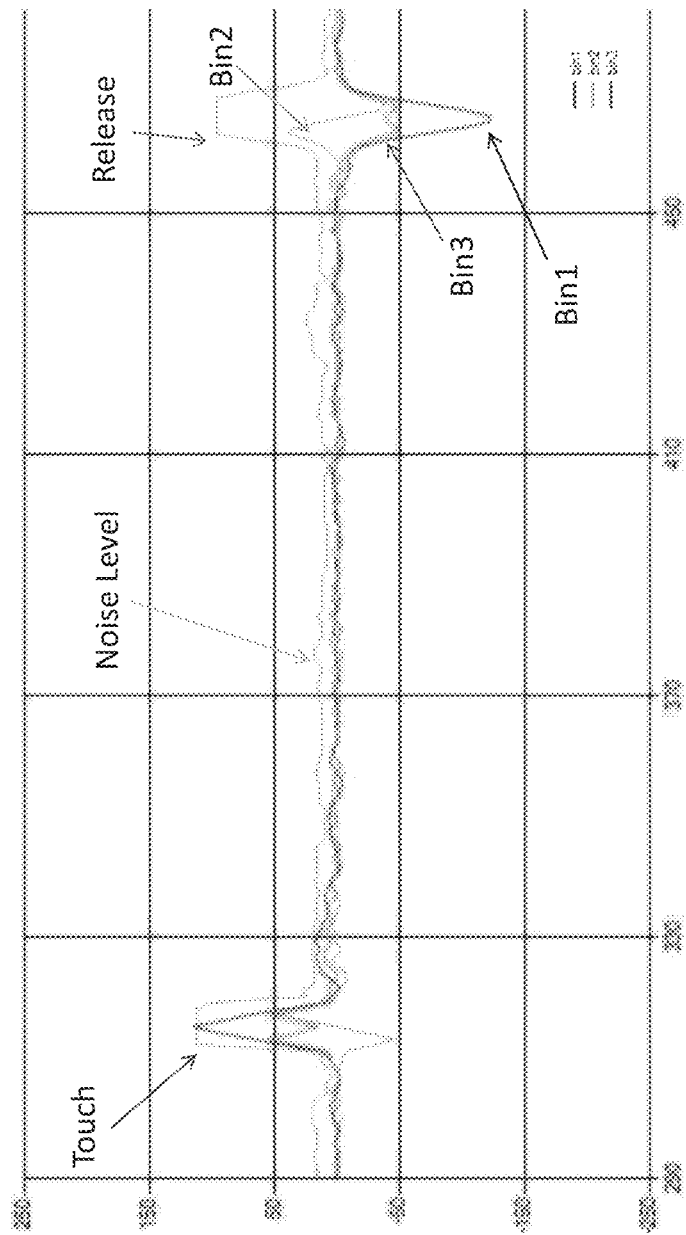
FIG. 22 illustrates the sequency domain distribution curves associated with sequency bins 1-3 and the absolute summation of the sequency domain distribution curves associated with sequency bins 4-7 superimposed on each other during touch, extended hold, and release events.

Although the foregoing method could be used to determine touch and release for quick taps (quick touch and release with no or minimal hold), it could yield ambiguous results if applied to long key presses (touch followed by extended hold followed by release). As set forth above, the dynamic noise level is a summation of absolute values and, therefore, always is zero or positive. Also, both touch and release are accompanied by an increase in noise and noise is at a minimum or relatively low during the untouched state and the hold state. These phenomena are illustrated in FIG. 22, wherein touch and release appear similar and may be confused. According to an eleventh method, the sign (positive or negative) of the signal in bin 1 may be used better discriminate between touch and release. A touch may be deemed to have occurred when the noise level increases and the sign of the signal component in bin 1 is positive. Similarly, a release may be deemed to have occurred when the noise level increases and the sign of the signal component in bin 1 is negative.

The foregoing describes illustrative methods of determining touch and/or release. Other methods could be used, as well. Also, touch and/or release could be determined using any combination of the foregoing and/or other methods. For example, one method could be used to determine whether or not a touch or release has occurred and another method could be used to confirm that the touch or release has occurred. Further, the combination of methods could include use of a time domain or other conventional technique for determining touch and/or release. For example, a frequency domain or sequency domain technique could be used to determine whether or not a touch or release has occurred and a time domain technique could be used to confirm that the touch or release has occurred. Using a combination of methods or techniques to determine touch and release could yield improved accuracy and/or reliability.

Again, the Walsh-Hadamard transform described herein involves multiplication of an eight point rolling sample of capacitive signals by an 8×8 Walsh matrix, yielding transformed signals in eight signal (sequency) bins. In other embodiments, the Walsh-Hadamard transform could be performed on a longer or shorter rolling sample of raw data by application of a correspondingly-sized Walsh matrix on the sample. For example, the Walsh-Hadamard transform could be performed by applying a 4×4 Walsh matrix to a 4 point rolling sample, or it could be performed by applying a 16×16 Walsh matrix to a 16 point rolling sample. In other embodiments, a Walsh matrix of any size n×n could be applied to a correspondingly sized rolling sample having n points to yield transformed data in n signal (sequency) bins numbered 0 through n−1, where $n=2^x$ and x is an integer greater than or equal to 2. As such, the Walsh-Hadamard transform is scalable.

In general, smaller transforms require less computation, but yield fewer sequency bins. Similarly, larger transforms yield more sequency bins, but also require more computation. More sequency bins may be more desirable in certain applications because they provide more data (or data in more forms).

The data in certain sequency bins might be more useful than the data in others. Indeed, the data in some sequency bins might not be particularly useful in a particular application. For example, the data in some sequency bins may be indicative only or predominantly of noise, which might not be useful in determining whether a touch event has occurred. As such, it might not be necessary to calculate a value for each sequency bin when performing the Walsh-Hadamard transform. Instead, it might be sufficient to identify the sequency bins expected to contain the data necessary or desirable for a particular application, to compute the data only for those bins, and to not compute the data that would be contained in other bins. Performing the Walsh-Hadamard transform selectively in this manner could significantly reduce the load on the processor used to perform the corresponding computations. For example, if it is known that the data in sequency bins 0-5 will be used in determining whether a touch event has occurred and the data in sequency bins 6 and 7 will not be used, the values for sequency bins 6 and 7 need not be calculated. Selectively omitting calculations in this manner may considerably reduce the demand on the processor and save considerable processing time.

The present disclosure has thus far described use of a Walsh-Hadamard Transform to transform capacitive signals from the time domain to the sequency domain. In alternative embodiments, a Fourier Transform or Fast Fourier Transform (FFT) could be used in a similar manner to transform capacitive signals from the time domain to the frequency domain, as would be understood by one skilled in the art. In further embodiments, other types of transforms could be used in a similar manner to transform capacitive signals from the time domain to the frequency or sequency domains, as would be understood by one skilled in the art.

Figure 23:
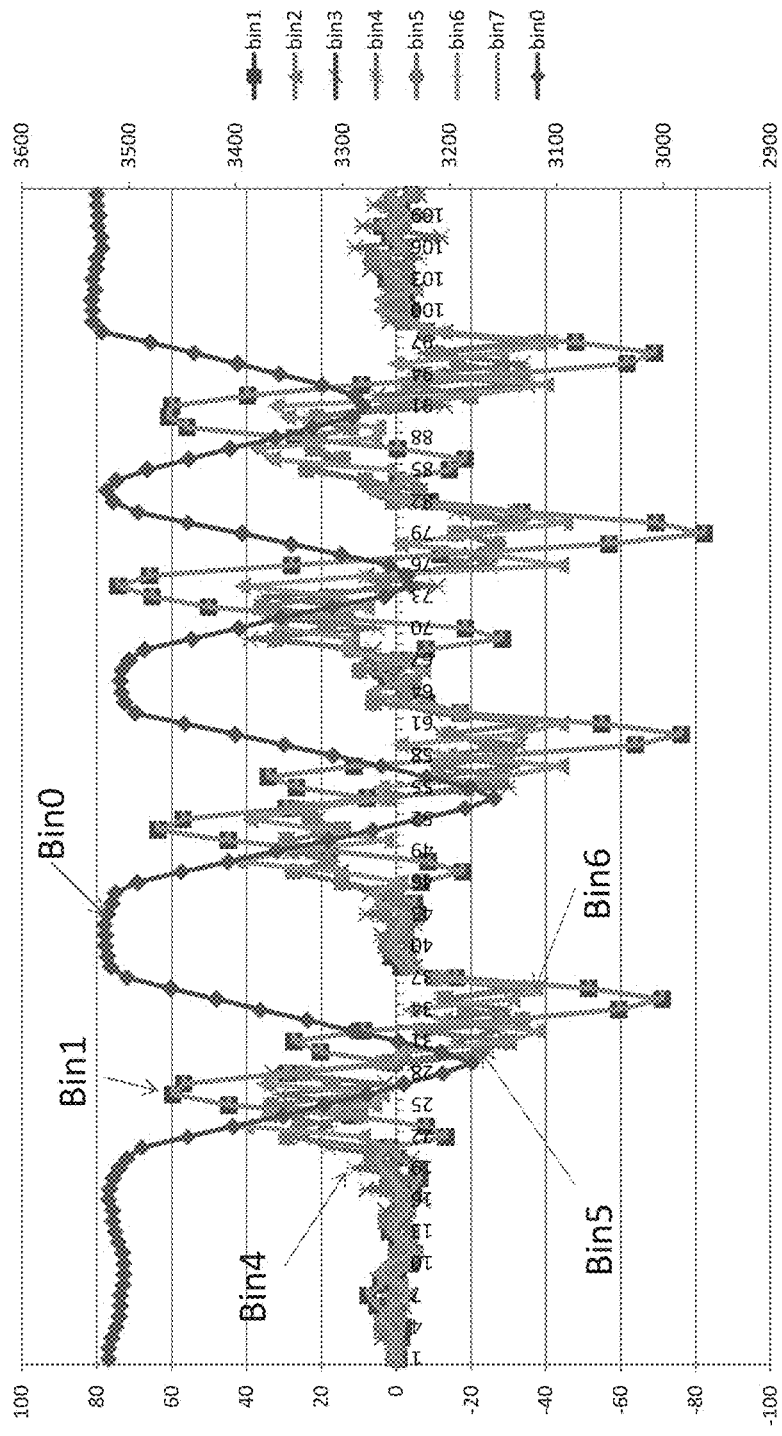
FIG. 23 illustrates frequency domain distribution curves showing real data associated with frequency bins 0-7.
Figure 24:
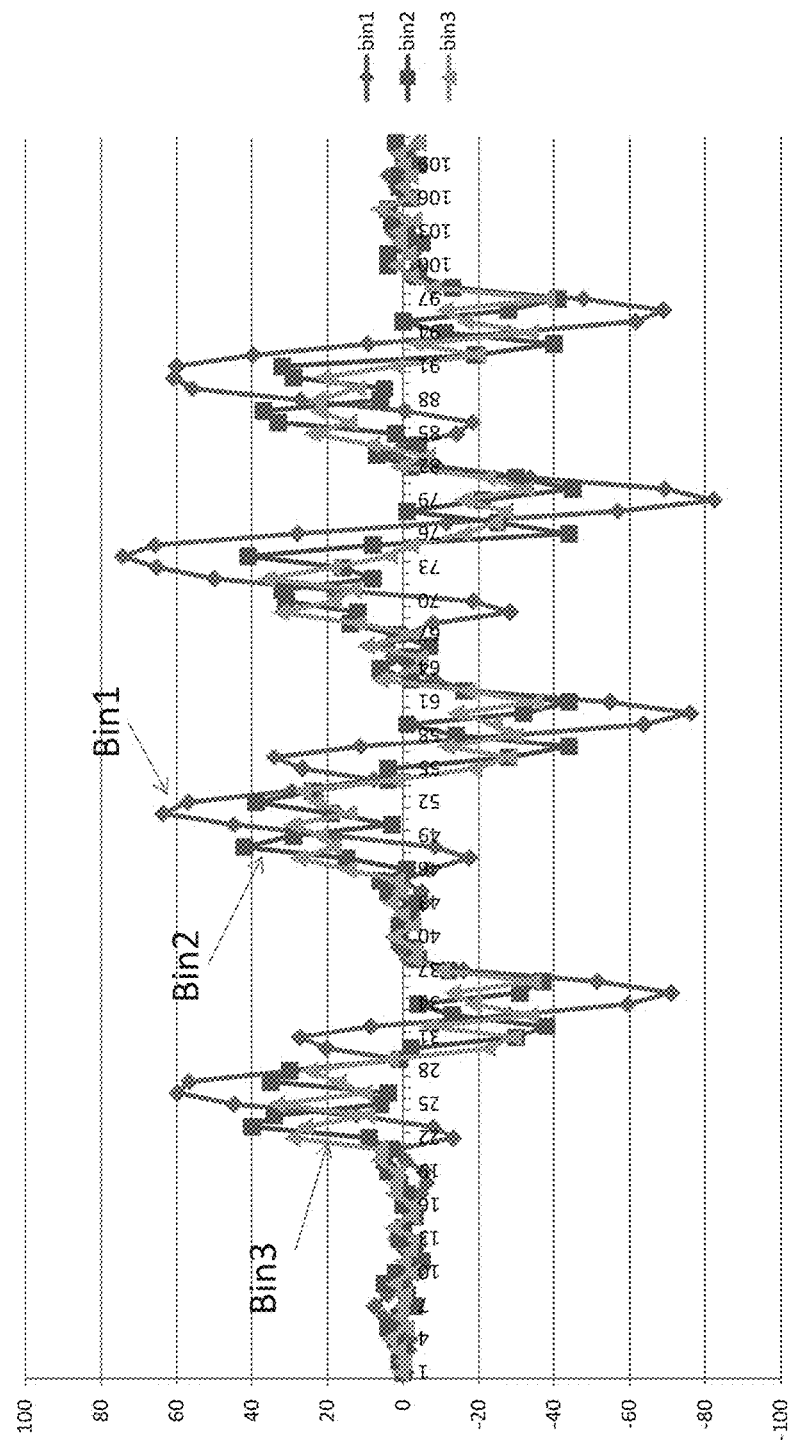
FIG. 24 illustrates frequency domain distribution curves showing real data associated with frequency bins 1-3.
Figure 25:
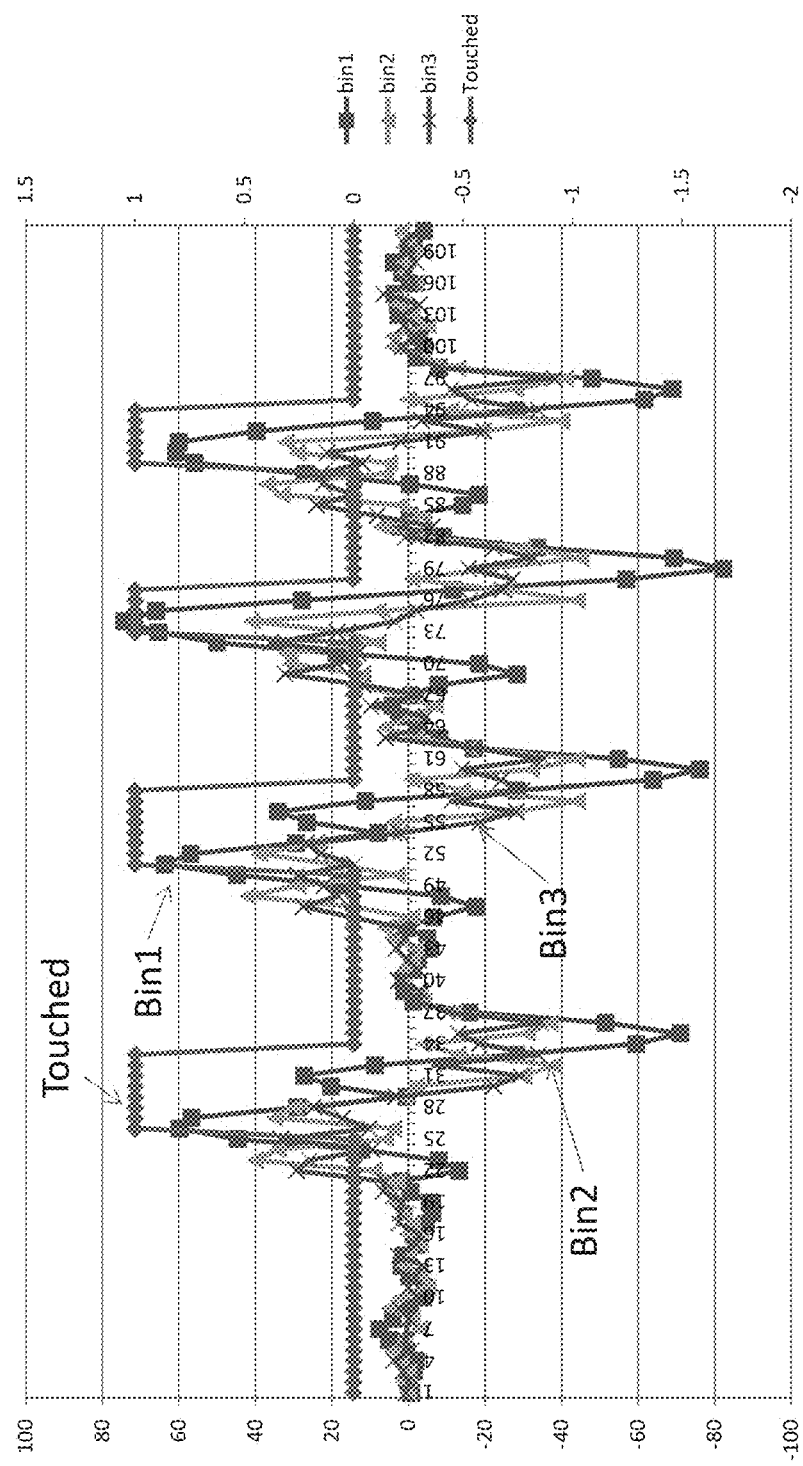
FIG. 25 illustrates frequency domain distribution curves showing real data associated with frequency bins 1-3 and indicative of touch events.
Figure 26:
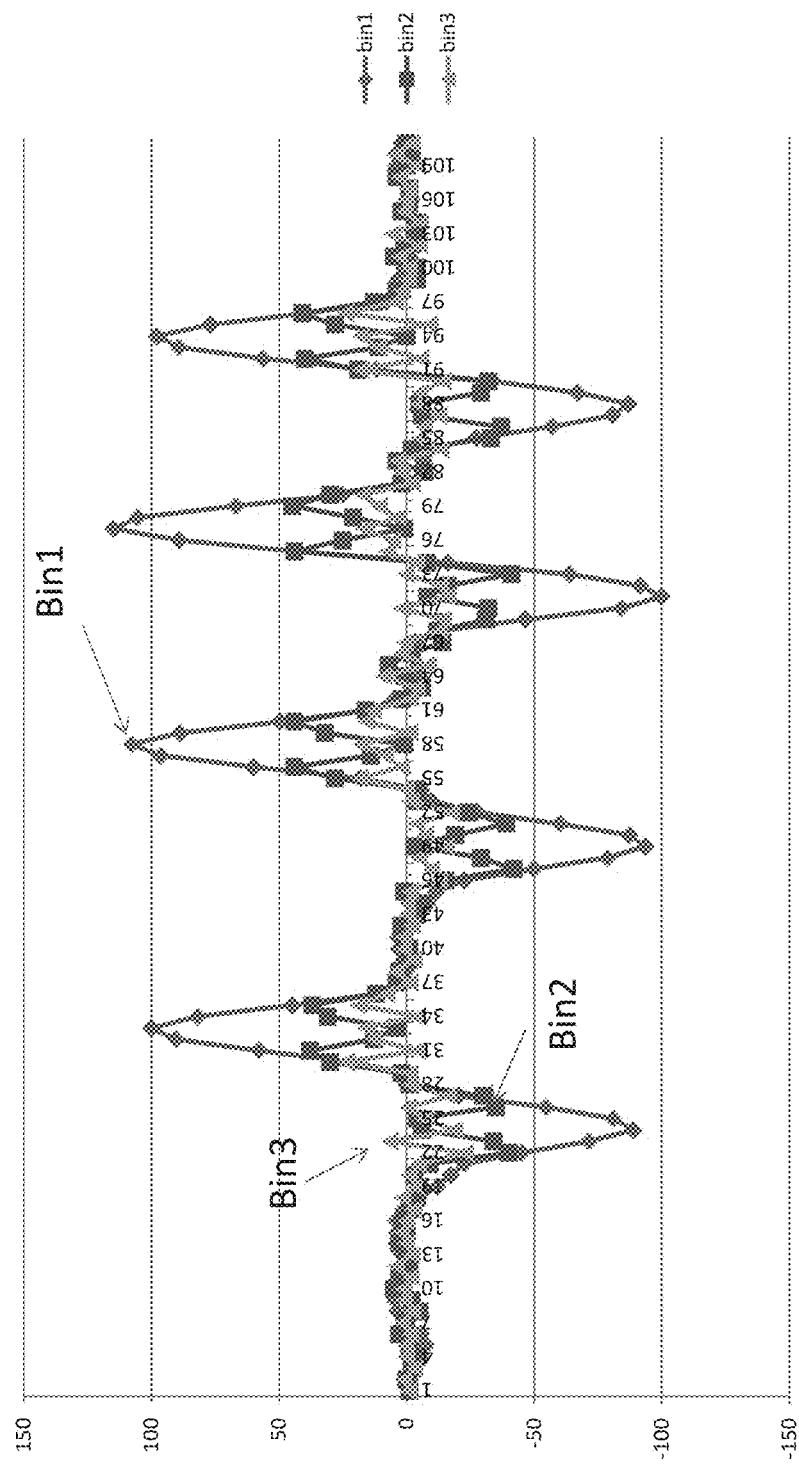
FIG. 26 illustrates frequency domain distribution curves showing imaginary data associated with frequency bins 1-3.
Figure 27:
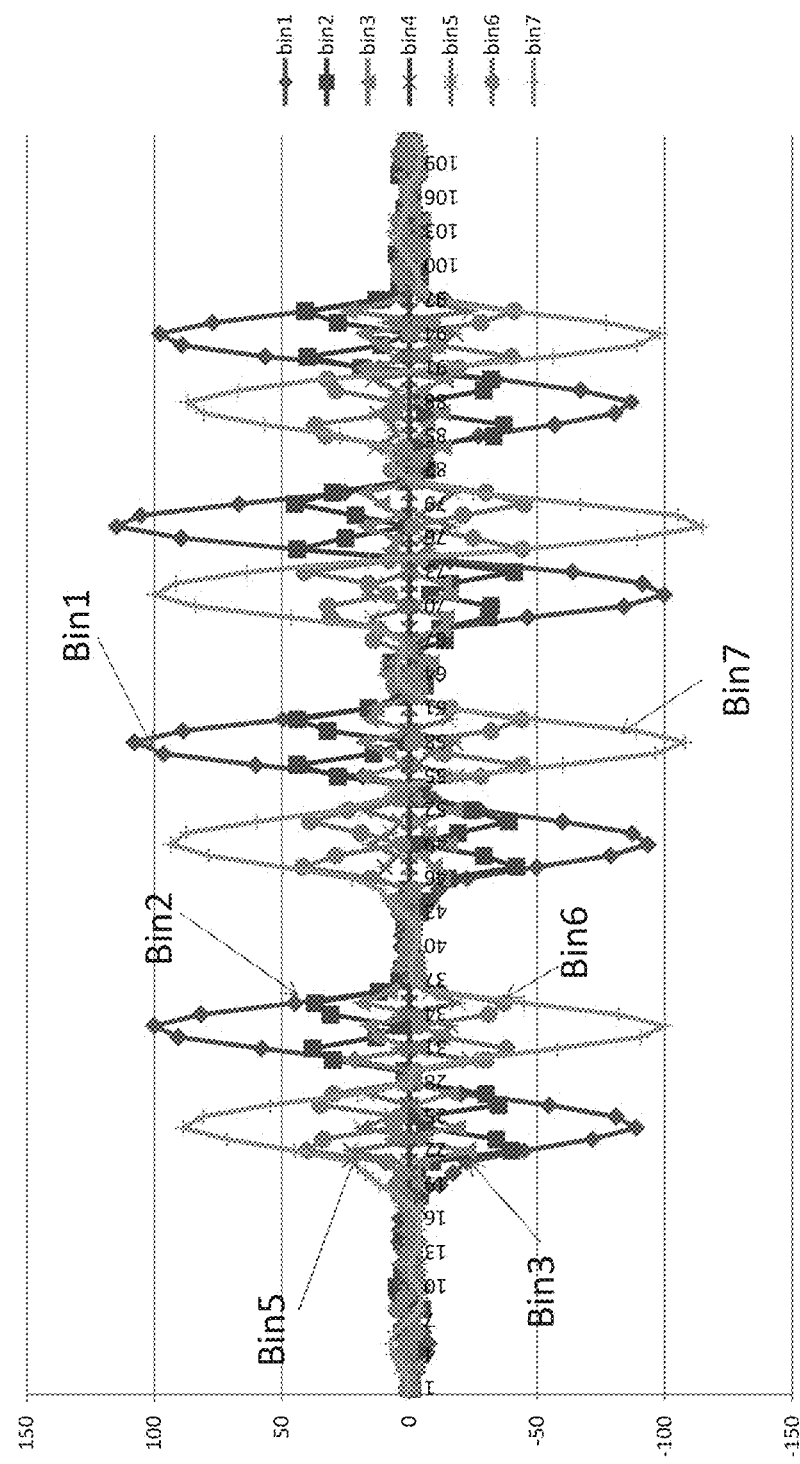
FIG. 27 illustrates frequency domain distribution curves showing imaginary data associated with frequency bins 1-7.
Figure 28:
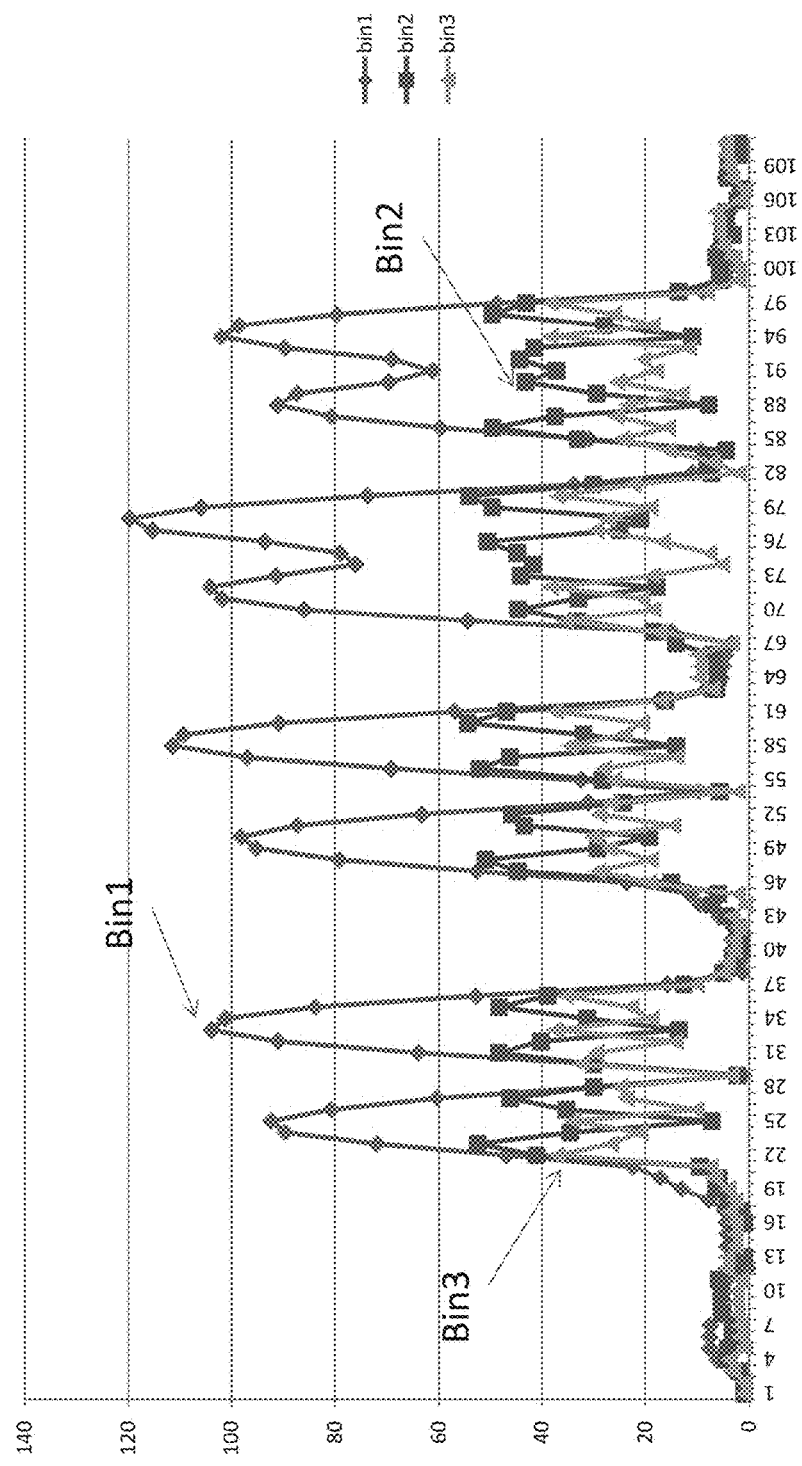
FIG. 28 illustrates frequency domain distribution curves showing magnitude data associated with frequency bins 1-3.

For example, the principles of the disclosure could be applied to embodiments using an FFT. FIGS. 23-29 illustrate distribution curves for eight frequency bins in the frequency domain resulting from application of an 8×8 FFT to the time domain data of FIG. 3. More specifically, FIG. 23 illustrates frequency distribution curves for the real data in frequency bins 0-7. FIG. 24 illustrates frequency distribution curves for the real data in frequency bins 1-3. FIG. 25 illustrates frequency distribution curves for the real data in frequency bins 1-3 and identifies touched and untouched states. FIG. 26 illustrates frequency distribution curves for the imaginary data in frequency bins 1-3. FIG. 27 illustrates frequency distribution curves for the imaginary data in frequency bins 1-7. FIG. 28 illustrates frequency distribution curves for the magnitude data in frequency bins 1-3. FIG. 29 illustrates frequency distribution curves for the magnitude data in frequency bins 1-7. The principles of the disclosure could be used to determine touch and release events using the frequency domain data resulting from application of the FFT in a manner analogous to that described above in connection with the sequency domain data.

The disclosure thus far has illustrated and described applications involving a single electrode touch sensor and principles of self-capacitance. The principles of the disclosure could be applied to other electrode structures, as well. For example, the principles of the disclosure could be applied to electrode structures including first and second, or drive and sense electrodes and involving principles of mutual capacitance. Such sensors could be discrete sensors or portions of a touch screen having plural drive and sense lines. Also, the principles of the disclosure could be applied to field effect or active sensors, for example, sensors as disclosed in U.S. Pat. No. 5,594,222, the disclosure of which is incorporated herein by reference.

FIG. 30 illustrates an embodiment including four spaced apart x (or drive) electrodes D1-D4 and a single y (or sense) electrode S configured as four touch detection zones T1-T4.

This electrode structure could be used, for example, as a slider and/or as four discrete keys.

FIG. 31 illustrates an embodiment including four dedicated x or drive electrodes D1-D4 and a single y or sense electrode S configured as a single touch detection zone T. More specifically, each intersection of a drive line D1-D4 with the sense line S comprises a touch detection node. The set of nodes comprises a single touch detection zone or key. A touch detection zone or key comprising multiple nodes can exhibit increased resistance to the effects of electromagnetic interference (EMI), presence of water, and/or to reduce capacitive loading (and thereby increase sensitivity). The multiple nodes could be set up as differential pairs or individually. Where set up individually, the outputs of the several nodes can be compared according to a predetermined algorithm and a touch may be deemed to have occurred only when a predetermined number and/or geometric arrangement of the nodes is deemed to have been touched according to any of the foregoing techniques. This electrode structure could be used, for example, as a hand sensor for an automobile door handle.

The foregoing paragraph describes a mutual capacitance mode of operation. In another embodiment, the system could be operated in a self-capacitance mode. The outputs of the several touch detection nodes could be analyzed as individual signals according to a predetermined algorithm. A touch to the touch detection zone may be deemed to occur only when a predetermined number and/or geometric arrangement of the touch detection nodes is deemed to have been touched according to any of the foregoing techniques.

Figure 32:
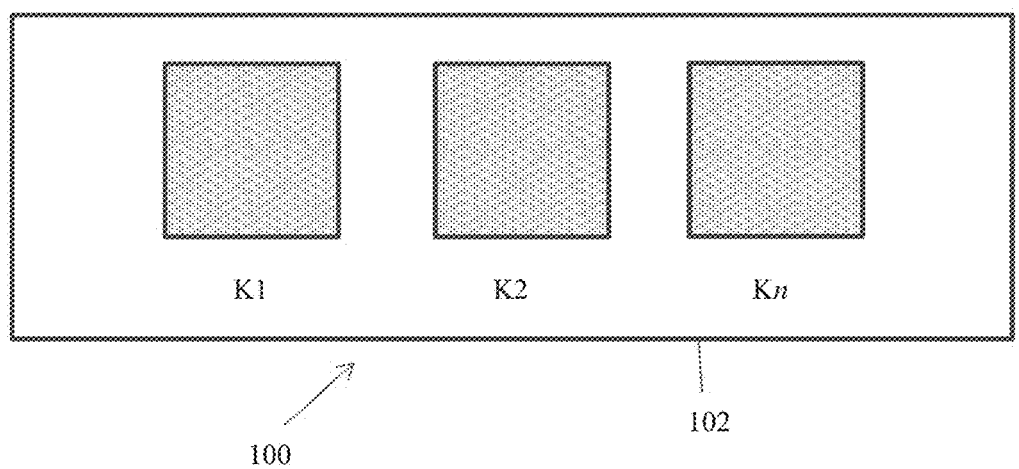
FIG. 32 illustrates a plurality of capacitive sensors arranged as keys of a slider.

FIG. 32 illustrates a low resolution slider 100 comprising a plurality of keys K1-Kn arranged linearly on a panel 102. The panel 102 could be analogous to the touch surface substrate 18 described above. The keys K could be discrete ones of the capacitive sensor 10 described above disposed on a circuit carrier associated with the panel 102 in a similar manner. Alternatively, the panel 102 could be a touch screen and each key K could be a touch detection zone T of an electrode structure having one or more drive electrodes and one or more sense electrodes, for example, as shown in FIG. 30 and described above.

The slider 100 may include n keys, where n could be any desired number as low as 2. That is, the slider 100 could have as few as two keys or as many keys as desired. For the slider shown in FIG. 32, n=3.

The slider 100 may be operated by initially touching a touch surface corresponding to one of the keys K with a stimulus, for example, a user's finger, and then sliding the stimulus to or toward a touch surface corresponding to one or more others of the keys.

The location of the initial touch to the slider 100 can be determined using the principles and any of the techniques discussed above. The key corresponding to the initial touch location may be initially deemed the "current" key. (An initial touch of a stimulus between a pair of adjacent keys may sufficiently affect the capacitance about the keys to be recognized as a touch to one of the keys.) The subsequent locations of the stimulus as it slides across the slider 100 from one key to one or more other keys could be determined by periodically monitoring the bin 1 values of all of the keys of the slider, and comparing those values to each other and to a predetermined threshold. If the bin 1 value of a key other than the "current" key is the greatest bin 1 value of any key of the slider 100 and also is greater than the predetermined threshold, that key becomes the new "current" key. The predetermined threshold could be lower than a threshold required for determining the initial touch. Release may be determined from the "current" key. Release may be determined using the principles and any of the techniques described above.

For example, a slide may be executed by first touching a finger or other stimulus to the touch surface corresponding to Key 1, then sliding the finger to or toward the touch surface corresponding to Key 2. The initial touch to Key 1 may be detected using any of the techniques described above. Key 1 is initially deemed the "current" key. The bin 1 values of all n keys in the slider 100 are then monitored and compared to the bin 1 values of each other. When the stimulus is slid from Key 1 to Key 2, the bin 1 value of Key 1 decreases and the bin 1 value of Key 2 increases. With the stimulus closer to Key 2 than any other key n, the bin 1 value of Key 2 becomes higher than the bin 1 value of any other key n. If the bin 1 value of Key 2 also is higher than the predetermined threshold, Key 2 becomes the new "current" key. A continuing slide from Key 2 to or toward another key n may be determined in the same manner. Release of the stimulus from the slider may be detected using any of the techniques described above.

In an embodiment, the slider 100 could be disposed in or on an automobile door handle and used to selectively lock and unlock the door. A slide may be deemed to have been completed when all or a predetermined minimum number of the keys of the slider 100 have been actuated or "slid across" sequentially. The direction of the slide, for example left to right or upper to lower, may be determined by the start and end positions, that is, as a function of the location of the key where the initial touch occurred and the location of the key where the release occurred. Alternatively, the direction of the slide could be determined based on the relative locations of any pair of touched keys as a function of time. A completed slide in one direction could be used as a basis to lock the door, and a completed slide in the other direction could be used as a basis to unlock the door.

Figure 37:
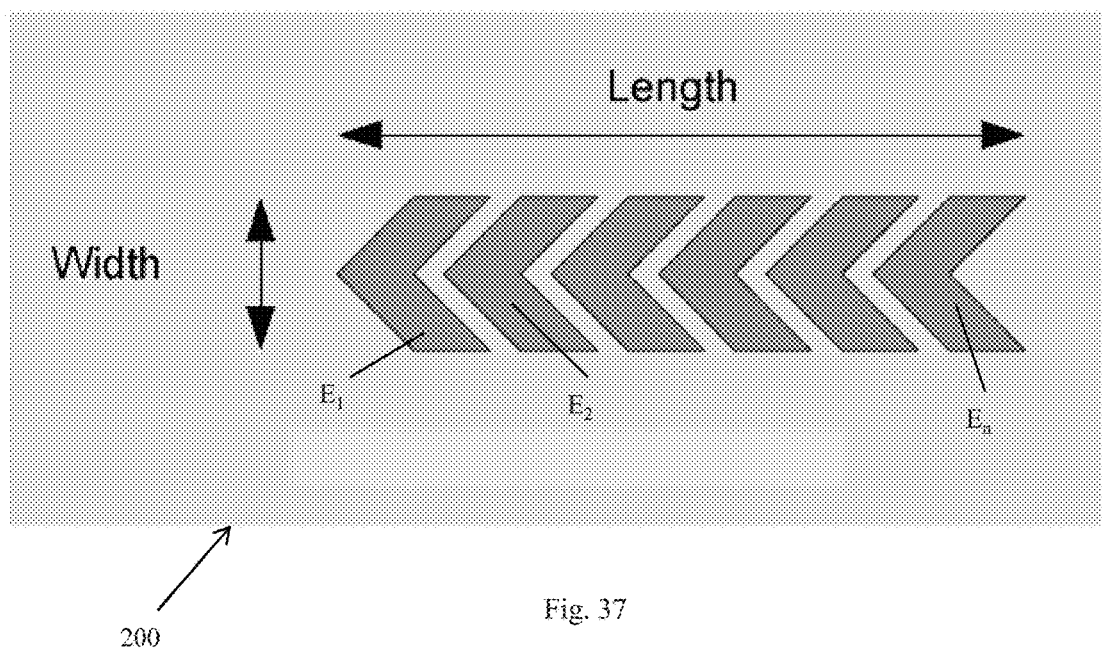
FIG. 37 illustrates a spatially interpolated electrode pattern for a slider.

FIG. 37 illustrates a slider 200 having a spatially-interpolated pattern of electrodes $E_1$-$E_n$. The foregoing techniques could be used to determine location of an initial touch to the slider and gross movement of a stimulus from electrode to electrode. Known interpolation techniques could be used to determine fine movement of the stimulus with respect to a pair of adjacent electrodes.

Figure 38:
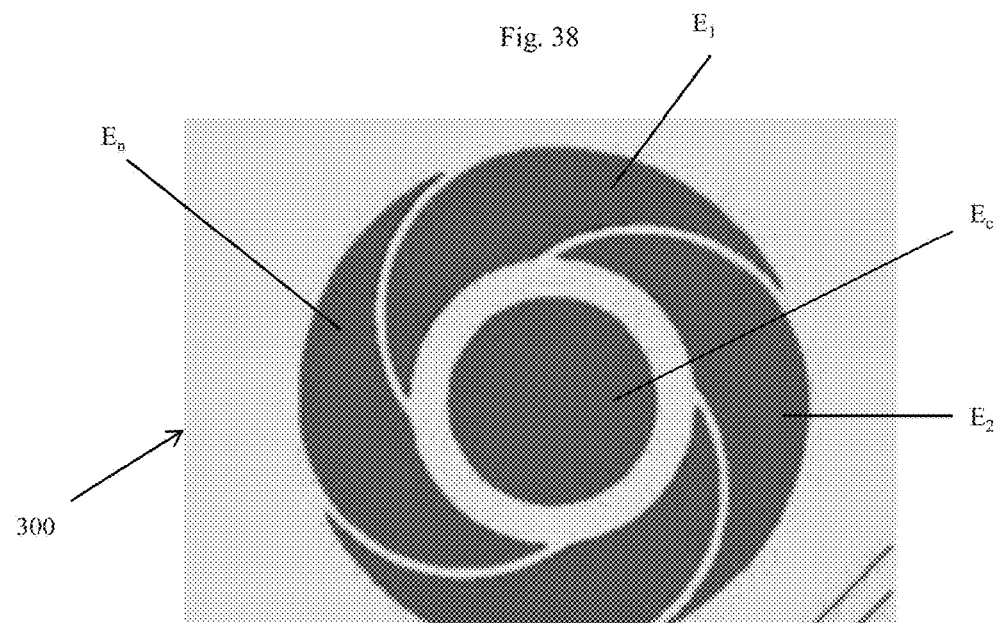
FIG. 38 illustrates a spatially interpolated electrode pattern for a rotor.

FIG. 38 illustrates a rotor 300 having a center electrode $E_C$ and a plurality of spatially-interpolated circumferentially-arranged electrodes $E_1$-$E_n$ surrounding the center electrode. The foregoing techniques could be used to determine location of an initial touch to the center electrode or one or more of the circumferential electrodes of the rotor and gross movement of a stimulus from electrode to electrode. Known interpolation techniques could be used to determine fine movement of the stimulus with respect to a pair of adjacent electrodes, especially overlapping circumferential electrodes.

Figure 39:
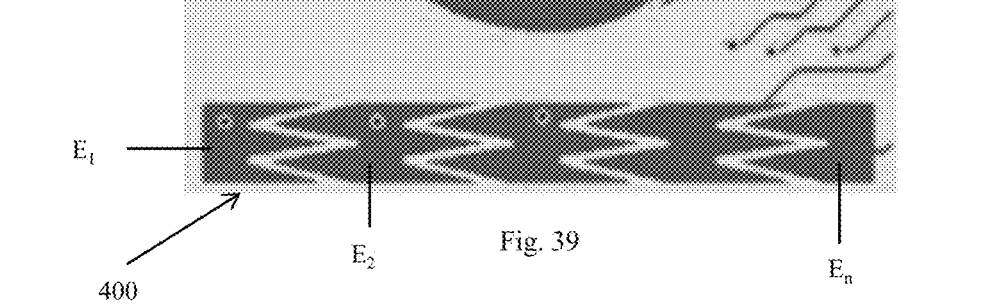
FIG. 39 illustrates another spatially interpolated electrode pattern for a slider.

FIG. 39 illustrates another slider 400 having a spatially-interpolated pattern of electrodes $E_1$-$E_n$. The foregoing techniques could be used to determine location of an initial touch to the slider and gross movement of a stimulus from electrode to electrode. Known interpolation techniques could be used to determine fine movement of the stimulus with respect to a pair of adjacent electrodes.

Figure 40:
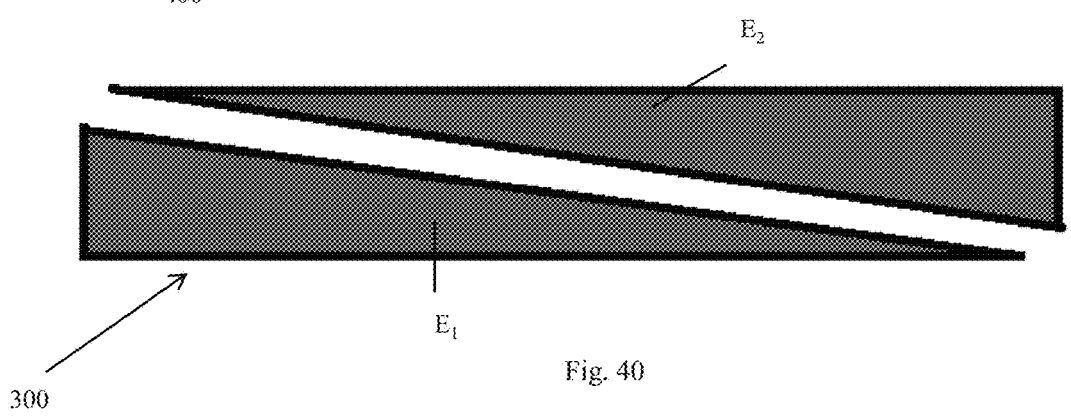
FIG. 40 illustrates a proportionally interpolated electrode pattern for a slider.

FIG. 40 illustrates a further slider 500 having a pair of proportional electrodes $E_1$-$E_2$. The foregoing techniques could be used to determine location of an initial touch to either or both of the electrodes of the slider 500. Known interpolation techniques could be used to determine the position of the stimulus between the ends of the pair of electrodes.

Figure 41:
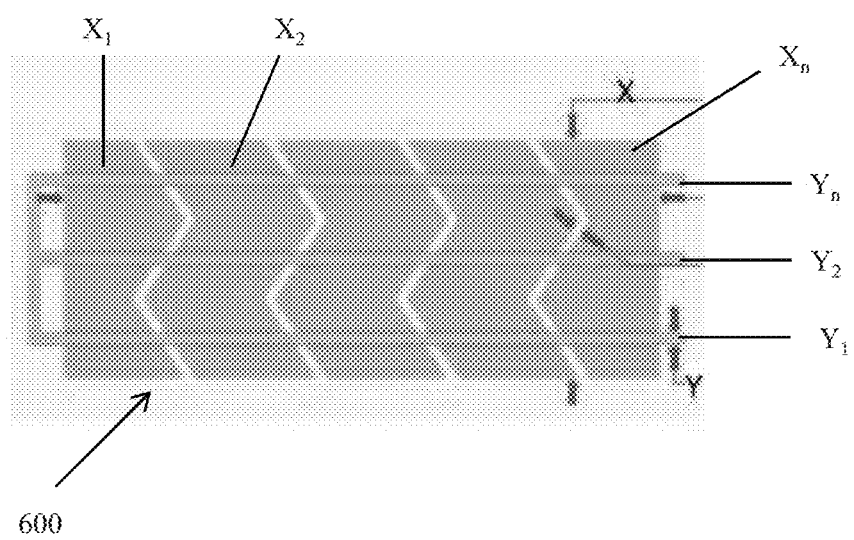
FIG. 41 illustrates a spatially interpolated electrode pattern for a mutual capacitance slider.
Figure 4B:
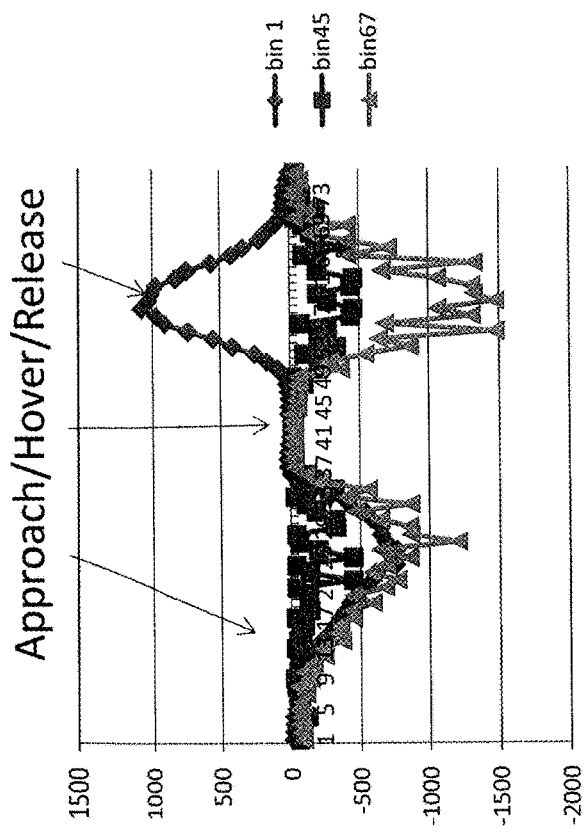
Figure 4B:
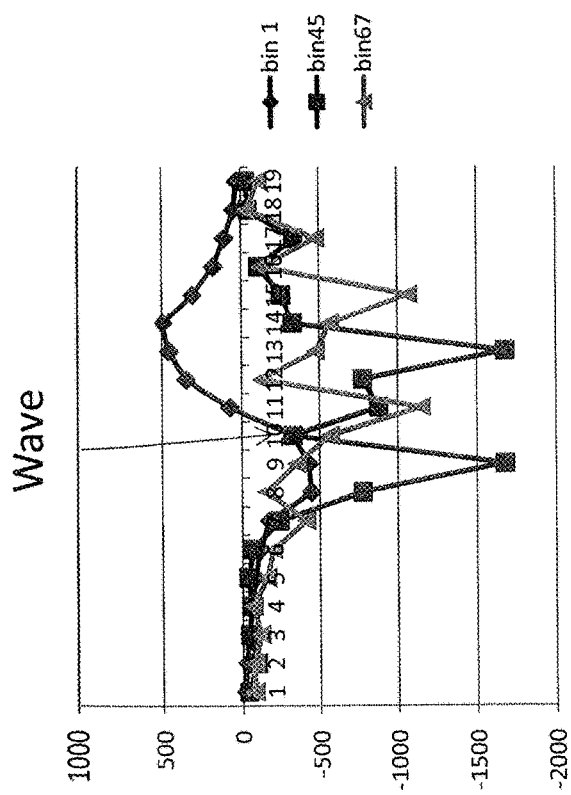

FIG. 41 illustrates a slider 600 having a plurality of spatially interpolated x electrodes $X_1$-$X_n$ and a plurality of y electrodes Y1-Yn extending across the plurality of x electrodes. The x and y electrode configuration of the slider 600 allows operation thereof using principles of mutual capacitance, rather the self-capacitance. The foregoing techniques could be used to determine location of an initial touch to the slider and gross movement of a stimulus from electrode to electrode. Known interpolation techniques could be used to determine fine movement of the stimulus with respect to a pair of adjacent electrodes.

Figure 33:
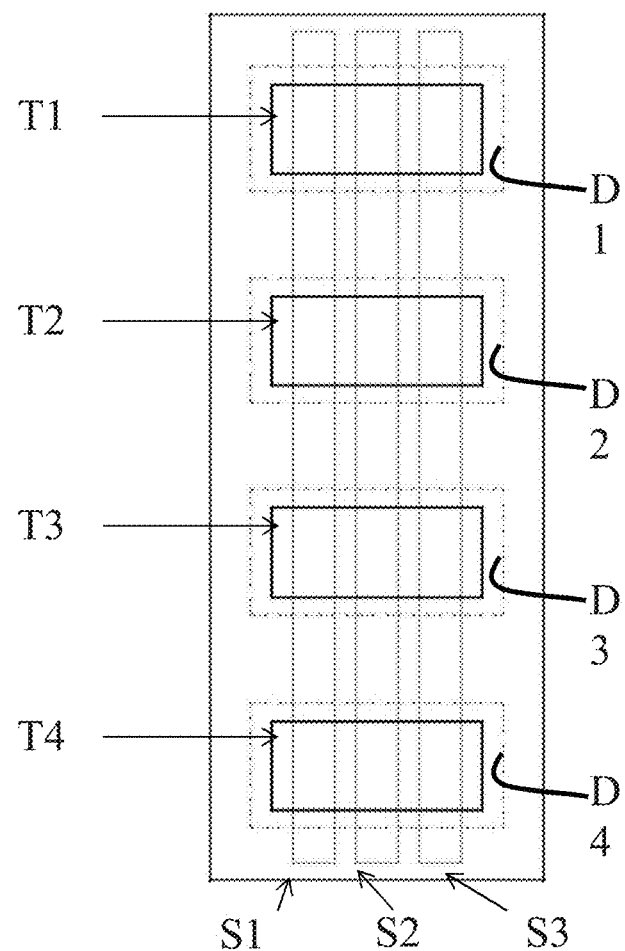
FIG. 33 illustrates an electrode a further alternate electrode structure.

The foregoing techniques could be applied to a touch screen or touch pad having at least two touch detection nodes defined by a combination of drive and sense lines. For example, a plurality of touch detection nodes may be defined by a single drive line and plural sense lines, a single sense line and plural drive lines, or plural drive lines and plural sense lines. FIG. 30 is illustrative of a touch pad or touch screen having four drive lines and a single sense line defining four touch detection nodes arranged in a linear fashion as a slider. The slider of FIG. 30 could be modified to include fewer or further drive lines to thereby define fewer or further touch detection nodes. The slider of FIG. 30 also could be modified to include at least two drive lines and at least two sense lines to define four or more touch detection zones in a two-dimensional arrangement. For example, FIG. 33 illustrates an example of an electrode structure for a touch screen or touch pad having four drive lines and three sense lines. The twelve touch detection nodes defined by the intersections thereof are arranged as four touch detection zones T1-T4. Other embodiments could have more or fewer drive and/or sense lines. Also, in other embodiments, each touch detection node defined by an intersection of a drive and sense line (or combinations thereof) could comprise an individual touch detection zone T.

Figure 34:
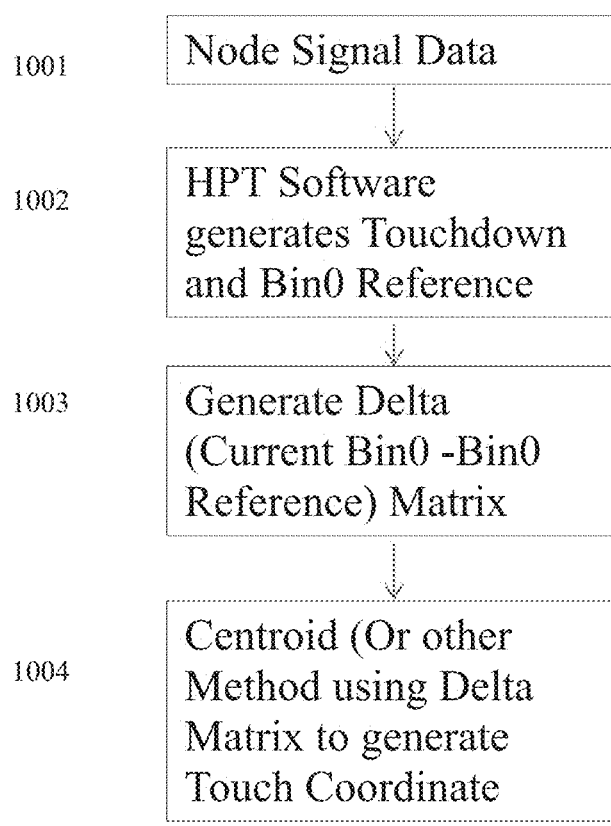
FIG. 34 is a flow chart showing an illustrative method of determining touch to a touch screen or touch pad.

FIG. 34 is a flow chart showing an illustrative method of determining a touch to a touch screen or touch pad using the foregoing techniques. At block 1001, the foregoing techniques may be applied to each node of a touch screen to determine the signal level there.

At block 1002, a bin 0 reference value for each node may be established by determining the bin 0 value of each node before any node is touched and before any stimulus is introduced in proximity to the touch screen. These bin 0 values may be referred to as "Bin 0 Before Touch" or "Bin 0 Reference." In an embodiment, there may be deemed to be no touch to any node of the touch screen and no proximity to the touch screen generally when the noise level for each node is below a predetermined threshold, the bin 1 value for each node is near zero (where "near zero" may be defined as being below the noise floor of the system as measured in Bin 1), and the previous Bin 1 value for each node also is near zero. Also at block 1002, a touch to or near any node(s) of the touchscreen may be determined using the foregoing techniques.

At block 1003, a delta value is determined for each node of the touch screen. The delta values are determined by subtracting the current Bin 0 value for each node from the node's Bin 0 Reference value. The delta values are entered into a table or matrix.

Figure 35:
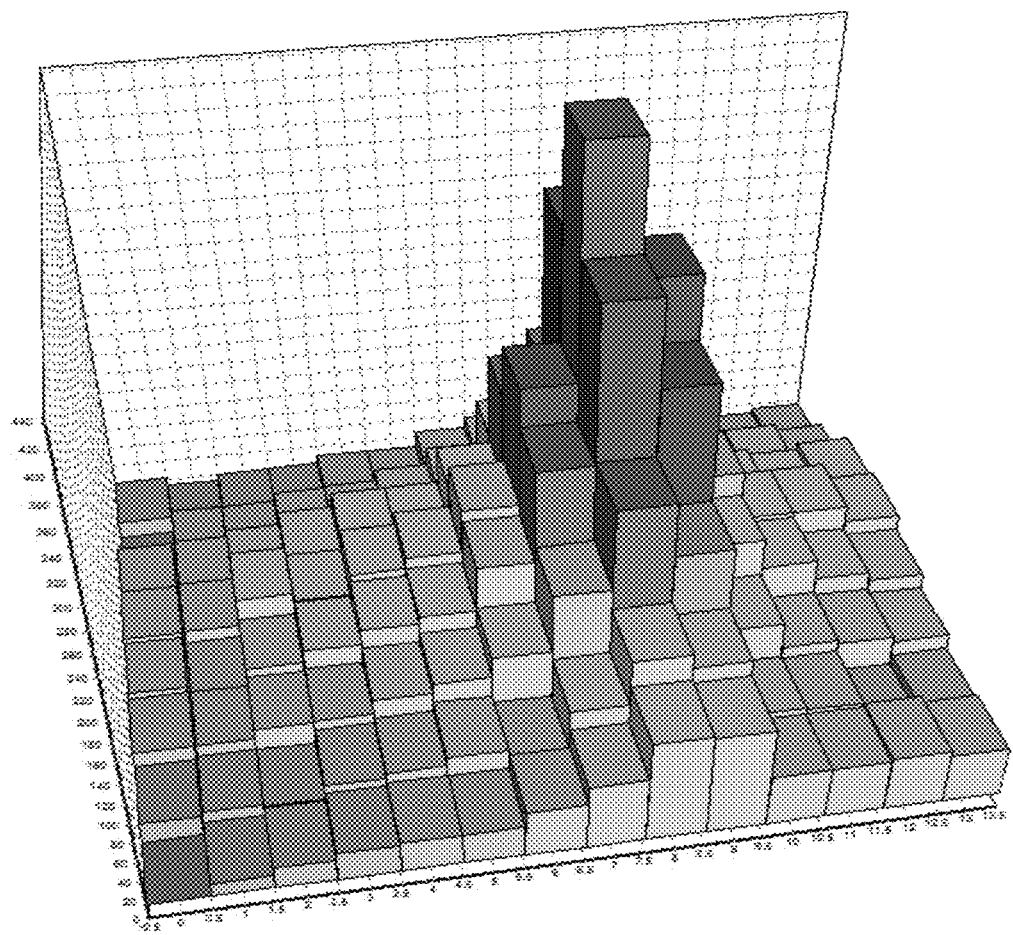
FIG. 35 is a three-dimensional graph representing an illustrative touch to a touch screen.

At block 1004, a two-dimensional centroiding technique can be applied to the matrix data to interpolate the touch location in terms of the touch screen's x and y coordinates, based on the delta values (current Bin 0 values minus reference Bin 0 values) for each node in response to touch of the touch screen. Such a technique may be used to determine the touch location in each coordinate based on the node in that coordinate having the highest signal value and the signal values of the adjacent nodes in that coordinate. FIG. 35 is a three-dimensional graph representing an illustrative touch to a touch screen in terms of the delta values (current Bin 0 values minus reference Bin 0 values) for each node in response to the touch.

Proximity (rather than touch) of a stimulus, for example, a user's hand or finger to a touch screen, slider, or keyboard may cause an increase or decrease in capacitance at several nodes simultaneously. The increase or decrease in capacitance at any one of the nodes may not be sufficient to yield a response indicative of a touch or proximity to such node. The sum of the increase or decrease in capacitance among several or all of the nodes, however, may be sufficient to yield a response indicative of proximity to the touch screen, slider or keyboard. As such, proximity to a touch screen, slider or keyboard can be determined by summing the raw capacitive signal values from all of the nodes of the touch screen, slider, or keyboard. The summed value can be offset to maintain it as a number having a predetermined number of bits, for example, 16 bits, 32 bits, or another number of bits. The summed value can then be transformed using the techniques described above. These techniques of can be applied to the transformed value to determine proximity, rather than touch, to the touch screen, slider or keyboard.

Figure 36:
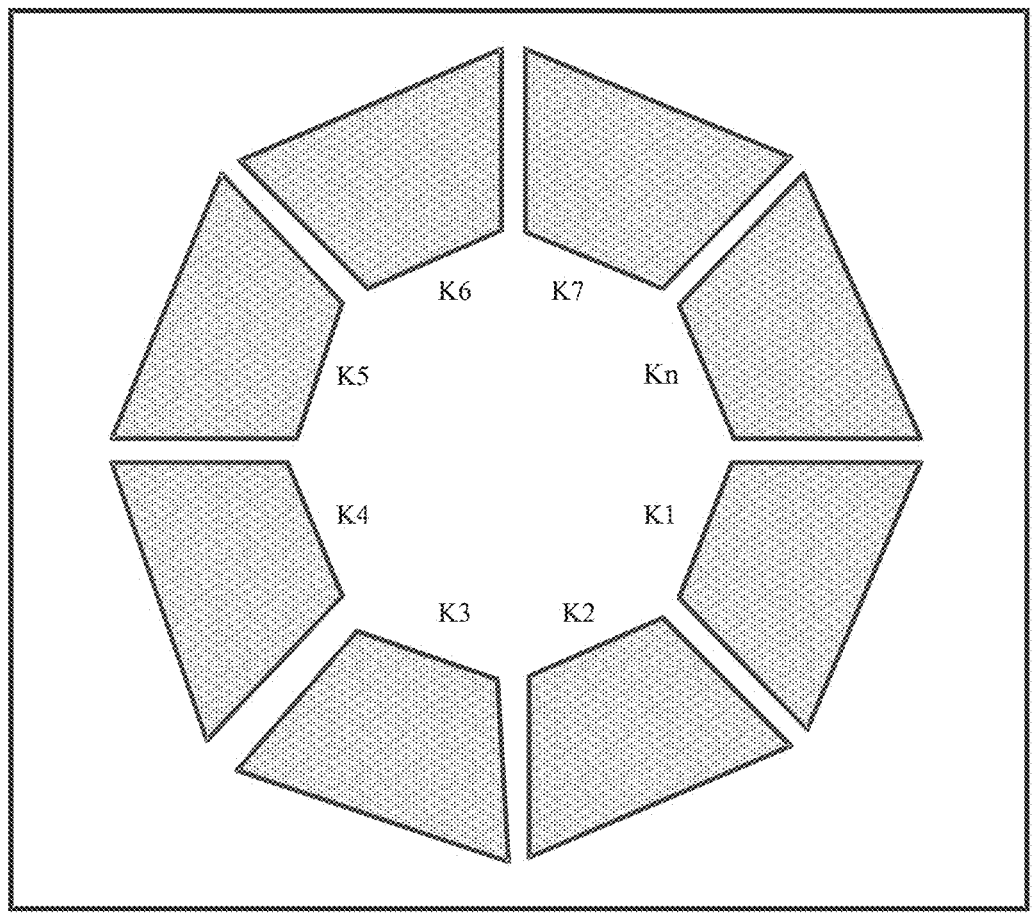
FIG. 36 illustrates a touch responsive rotor.

The foregoing techniques for determining location of a touch to a touch screen can be used to implement a high resolution slider by interpolating touch location in only a single dimension. A high resolution slider may be implemented in a manner similar to the slider 100 depicted above, but with a greater number of keys/channels/nodes and/or greater key/channel/node density. A rotor could be implemented in a similar manner, but with the keys/channels/nodes arranged in a circle, rather than a line. An illustrative embodiment of a rotor R having n keys K (where n=8 in the illustrated embodiment) is shown in FIG. 36.

The techniques described herein for determining touch to capacitive sensors, touch screens, sliders, and the like could be applied to other types of sensors, for example, infrared sensors, ultrasonic sensors, and accelerometers, among others, which may be used to detect a step change response of variable magnitude. For example, the foregoing techniques could be applied to the operation of an ultrasonic sensor configured to detect objects passing the field of view of the sensor. The objects may have different profiles and/or pass the sensor at different distances from the sensor. A conventionally-operated ultrasonic sensor that responds only to a specific threshold disturbance might not be able to reliably detect the presence of such objects. With the specific threshold set too high, the sensor would not reliably detect relatively small objects or objects at a relatively great distance from the sensor. With the specific threshold set too low, the sensor may be unduly sensitive to noise and thus yield false actuations. Applying the foregoing techniques to the operation of the sensor may allow more reliable detection of the presence of objects having different profiles and/or passing the sensor at different distances therefrom.

The disclosure thus far is generally directed to detection of touch and release of a stimulus to and from a sensor. The principles of the disclosure also may be applied to detection and recognition of gestures, for example, a wave gesture and an approach and hover gesture. Such gestures sufficiently near the sensor will elicit a response from the sensor, the response reflecting a change in sensor capacitance from the baseline as the stimulus, for example, a hand, approaches and then departs from the sensor. A wave gesture may be characterized by relatively high speed movement. A hover gesture may be characterized by a relatively low speed approach to the sensor followed by a dwell time over the sensor (and may be further characterized by a relatively low speed departure from the sensor).

Known methods for detecting and recognizing such gestures include analyzing data from two or more one or more one-dimensional ranging sensors, for example, infrared, ultrasonic, electric field, capacitive, or laser sensors. Although data from a single one of such sensors can be used to distinguish between a simple touch and release, a wave, or an approach, hover, and departure, methods of doing so using sensor data in the time domain typically rely on analysis of mere changes in the level of the signals output by the sensor.

According to the present disclosure, the signals output by the sensor in the time domain can be transformed from the time domain to the sequency domain using the principles discussed above. The transformed signals can then be analyzed in the sequency domain. For example, data in the upper sequency bins (bins n/2 through n−1 resulting from transformation of a rolling sample of n sensor signals using an n×n Walsh Hadamard Transform) may be manipulated and/or compared to determine the speed of a gesture, and data in the lower sequency bins (bins 0 though n/2−1 resulting from the foregoing transformation) may be compared to determine the type of the gesture and to reject noise.

In an embodiment, an eight point rolling sample of sensor data in the time domain is transformed to the sequency domain using an 8×8 Walsh Hadamard Transform. The data in sequency bin 1 is compared to the sum of the absolute values of the data in sequency bins 4 and 5 (which may be referred to herein as the data in bin 4+5) times a first gain factor and the sum of the absolute values of the data in sequency bins 6 and 7 (which may be referred to herein as the data in bin 6+7) times a second gain factor. The first and second gain factors may be identical or different. In an embodiment, either or both of the first and second gain factors may be 1. In another embodiment, the gain factor may be greater than or less than 1. Multiplication of the foregoing data by a gain factor greater than or less than 1 may facilitate the comparison of the foregoing data with the data in sequency bin 1. The gain factor may be a function of the length of the n point rolling sample. For example, the gain factor may be the negative of half the length of the rolling sample.

FIG. 42 is illustrative of data resulting from a wave gesture proximate the sensor transformed to the sequency domain as set forth above. The data in bin 4+5 reflects the sum of the absolute values of the data in sequency bins 4 and 5 times a first gain factor of −4, and the data in bin 6+7 reflects the sum of the absolute values of the data in sequency bins 6 and 7 times a second gain factor of −4. As shown, the data in bin 4+5 times the first gain factor resulting from the relatively rapid approach and departure of the stimulus has a larger negative value than the data in bin 6+7 times the second gain factor resulting from the same gesture. Also, the magnitude of the data in bin 4+5 times the first gain factor resulting from the relatively rapid approach and departure of the stimulus is much greater than that of the data in bin 1. These data are characteristic of a wave gesture proximate the sensor.

FIG. 43 is illustrative of such data resulting from an approach, hover, and departure gesture proximate the sensor. The data in bin 4+5 reflects the sum of the absolute values of the data in sequency bins 4 and 5 times a first gain factor of −4, and the data in bin 6+7 reflects the sum of the absolute values of the data in sequency bins 6 and 7 times a second gain factor of −4. As shown, the data in bin 4+5 times the first gain factor resulting from the relatively slow approach, hover, and departure of the stimulus has a much smaller negative value than both the data in bin 1 and the data in bin 6+7 times the second gain factor resulting from the same gesture. These data are characteristic of an approach, hover, and departure gesture proximate the sensor.

Although the foregoing principles can be applied to data from a single sensor to detect or recognize wave and approach, hover, and departure gestures proximate thereto, the principles also can be applied to data from one or more additional sensors to increase the field of view. Each sensor in a multiple sensor embodiment may be sampled individually according to the principles above.

The foregoing disclosure is intended to be illustrative and not limiting. Features disclosed in connection with a given embodiment may be applied to other embodiments unless context clearly indicates otherwise.

The invention claimed is:

1. A method for operating a capacitive sensor, comprising:
   providing a sensor electrode;
   periodically exciting the sensor electrode and thereby periodically generating an electric field about the sensor electrode and a capacitance between the sensor electrode and a reference potential;
   periodically determining in the time domain values of capacitance between the sensor electrode and the reference potential;
   continuously transforming a rolling sample of the periodically-determined values of capacitance from the time domain to a plurality of data signals in the frequency domain using a Fourier Transform, each of the data signals in a corresponding frequency bin resulting from the Fourier Transform and each of the data signals comprising values related to capacitance for corresponding samples of the rolling sample;
   analyzing in the frequency domain at least one of the plurality of data signals in the corresponding frequency bin; and
   determining whether a touch event has occurred based on the analysis in the frequency domain of the at least one of the plurality of data signals in the corresponding frequency bin;
   wherein the rolling sample is an n-point rolling sample including a current sample and n−1 samples immediately preceding the current sample, wherein the n−1 samples include a last sample, wherein $n=2^x$ and x is an integer greater than or equal to 2, and wherein performance of the Fourier Transform yields n frequency bins numbered 0 through n−1.

2. The method of claim 1 wherein a touch event is deemed to have occurred when the difference between a baseline value and the value of the current sample in a frequency bin 0 exceeds a predetermined threshold.

3. The method of claim 1 wherein a touch event is deemed to have occurred when the value of the last sample in a frequency bin 1 is greater than the value of the current sample in the frequency bin 1.

4. The method of claim 3 wherein a release is deemed to have occurred when the value of the current sample in the frequency bin 1 reaches a minimum.

5. The method of claim 1 wherein a touch event is deemed to have occurred when the difference between the value of the current sample in a frequency bin 1 and the value of the previous sample in the frequency bin 1 exceeds a predetermined threshold.

6. The method of claim 1 wherein a touch event is deemed to have occurred when the data signal in a frequency bin 1 crosses zero in the positive direction and then crosses zero in the negative direction.

7. The method of claim 1 wherein a touch event is deemed to have occurred when integration of successive non-negative transformed values of the samples in a frequency bin 1 yields a value that meets or exceeds a predetermined threshold.

8. The method of claim 1 wherein a release event is deemed to have occurred when the absolute value of the value yielded by integration of successive non-positive transformed values of the samples in a frequency bin 1 meets or exceeds a predetermined threshold.

9. The method of claim 1 wherein a touch event is deemed to have occurred when the sum of the values of the samples in a frequency bin 1 exceeds a system noise level by a predetermined multiplier.

10. The method of claim 9 wherein the multiplier is less than one.

11. The method of claim 9 wherein n is greater than or equal to 4 and the system noise level is determined by summing the absolute values of frequency bins n/2 through n−1.

12. The method of claim 1 wherein a touch event is deemed to have occurred when the absolute value of the value yielded by integration of successive non-positive transformed values of the samples in a frequency bin 1 meets or exceeds a predetermined threshold that is a function of a system noise level.

13. The method of claim 12 wherein n is greater than or equal to 4 and the system noise level is determined by summing the absolute values of frequency bins n/2 through n−1.

14. The method of claim 1 wherein a touch event is deemed to have occurred when a system noise level increases above a predetermined threshold.

15. The method of claim 14 wherein n is greater than or equal to 4 and the system noise level is determined by summing the absolute values of frequency bins n/2 through n−1.

16. The method of claim 1 wherein the Fourier transform is a Fast Fourier transform.

17. The method of claim 1 wherein the values related to capacitance comprise counts.

* * * * *